(12) United States Patent
Masuoka et al.

(10) Patent No.: US 9,673,321 B2
(45) Date of Patent: Jun. 6, 2017

(54) PILLAR-SHAPED SEMICONDUCTOR DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 32 days.

(21) Appl. No.: 14/806,053

(22) Filed: Jul. 22, 2015

(65) Prior Publication Data
US 2016/0155842 A1   Jun. 2, 2016

(30) Foreign Application Priority Data

Nov. 27, 2014   (WO) .................. PCT/JP2014/081455

(51) Int. Cl.
  *H01L 29/78*   (2006.01)
  *H01L 21/225*   (2006.01)
  (Continued)

(52) U.S. Cl.
  CPC ........ *H01L 29/7827* (2013.01); *H01L 21/225* (2013.01); *H01L 21/24* (2013.01);
  (Continued)

(58) Field of Classification Search
  CPC ............. H01L 29/7827; H01L 29/1037; H01L 29/42356
  See application file for complete search history.

(56) References Cited

U.S. PATENT DOCUMENTS 5,308,778 A * 5/1994 Fitch ................... H01L 21/8221
  257/E21.41
8,039,893 B2 * 10/2011 Masuoka .............. H01L 27/092
  257/329

(Continued)

FOREIGN PATENT DOCUMENTS

EP      1804286 A1    7/2007
JP    H02-188966 A    7/1990
  (Continued)

OTHER PUBLICATIONS

Morimoto, T. et al., "Self-Aligned Nickel-Mono-Silicide Technology for High Speed Deep Submicrometer Logic CMOS ULSI", *IEEE Transactions on Electron Devices*, vol. 42, No. 5, May 1995, pp. 915-922.

(Continued)

*Primary Examiner* — Matthew Landau
*Assistant Examiner* — Grant Withers
(74) *Attorney, Agent, or Firm* — Brinks Gilson & Lione

(57) ABSTRACT

An opening extending through a gate insulating layer and a gate conductor layer is formed in the circumferential portion of a Si pillar at an intermediate height of the Si pillar. A laminated structure including two sets each including a Ni film, a poly-Si layer containing donor or acceptor impurity atoms, and a $SiO_2$ layer is formed so as to surround the opening. A heat treatment is carried out to form silicide from the poly-Si layers and this silicide formation causes the resultant NiSi layers to protrude and come into contact with the side surface of the Si pillar. The donor or acceptor impurity atoms diffuse from the NiSi layers into the Si pillar to thereby form an $N^+$ region and a $P^+$ region serving as a source or a drain of SGTs.

9 Claims, 12 Drawing Sheets

(51) Int. Cl.
*H01L 21/24* (2006.01)
*H01L 21/265* (2006.01)
*H01L 21/768* (2006.01)
*H01L 21/8234* (2006.01)
*H01L 29/08* (2006.01)
*H01L 29/10* (2006.01)
*H01L 29/417* (2006.01)
*H01L 29/423* (2006.01)
*H01L 29/66* (2006.01)
*H01L 21/285* (2006.01)

(52) U.S. Cl.
CPC .. *H01L 21/26513* (2013.01); *H01L 21/28518* (2013.01); *H01L 21/28531* (2013.01); *H01L 21/768* (2013.01); *H01L 21/76805* (2013.01); *H01L 21/823437* (2013.01); *H01L 21/823487* (2013.01); *H01L 29/0847* (2013.01); *H01L 29/1037* (2013.01); *H01L 29/41741* (2013.01); *H01L 29/42356* (2013.01); *H01L 29/66666* (2013.01)

(56) References Cited

U.S. PATENT DOCUMENTS

| | | |
|---|---|---|
| 9,431,501 B2 * | 8/2016 | Masuoka ............ H01L 29/7827 |
| 2010/0213539 A1 | 8/2010 | Masuoka et al. |
| 2014/0008735 A1 | 1/2014 | Tsukidate |
| 2015/0017767 A1 * | 1/2015 | Masuoka .............. H01L 27/092 438/211 |
| 2015/0123193 A1 * | 5/2015 | Masuoka ............ H01L 21/2251 257/329 |
| 2015/0357438 A1 * | 12/2015 | Masuoka .............. H01L 21/324 438/268 |
| 2016/0204251 A1 * | 7/2016 | Masuoka ........ H01L 21/823814 257/329 |

FOREIGN PATENT DOCUMENTS

| | | |
|---|---|---|
| JP | 06-013623 A | 1/1994 |
| JP | 2010-258345 A | 11/2010 |
| JP | 2012-004473 A | 1/2012 |
| JP | 2014-013792 A | 1/2014 |
| WO | WO 2014/184933 A1 | 11/2014 |

OTHER PUBLICATIONS

Shibata, T. et al., "A New Field Isolation Technology for High Density MOS LSI", *Japanese Journal of Applied Physics*, vol. 18, 1979, pp. 263-267.

Takato, H. et al., "Impact of Surrounding Gate Transistor (SGT) for Ultra-High-Density LSI's", *IEEE Transactions on Electron Devices*, vol. 38, No. 3, Mar. 1991, pp. 573-578.

Thompson, S. et al., "Uniaxial-Process-Induced Strained-Si: Extending the CMOS Roadmap", *IEEE Transactions on Electron Devices*, vol. 53, No. 5, May 2006, pp. 1010-1020.

Ting, C. et al., "Study of Planarized Sputter-Deposited $SiO_2$", *J. Vac. Sci. Technol.*, vol. 15, No. 3, May/Jun. 1978, pp. 1105-1112.

* cited by examiner

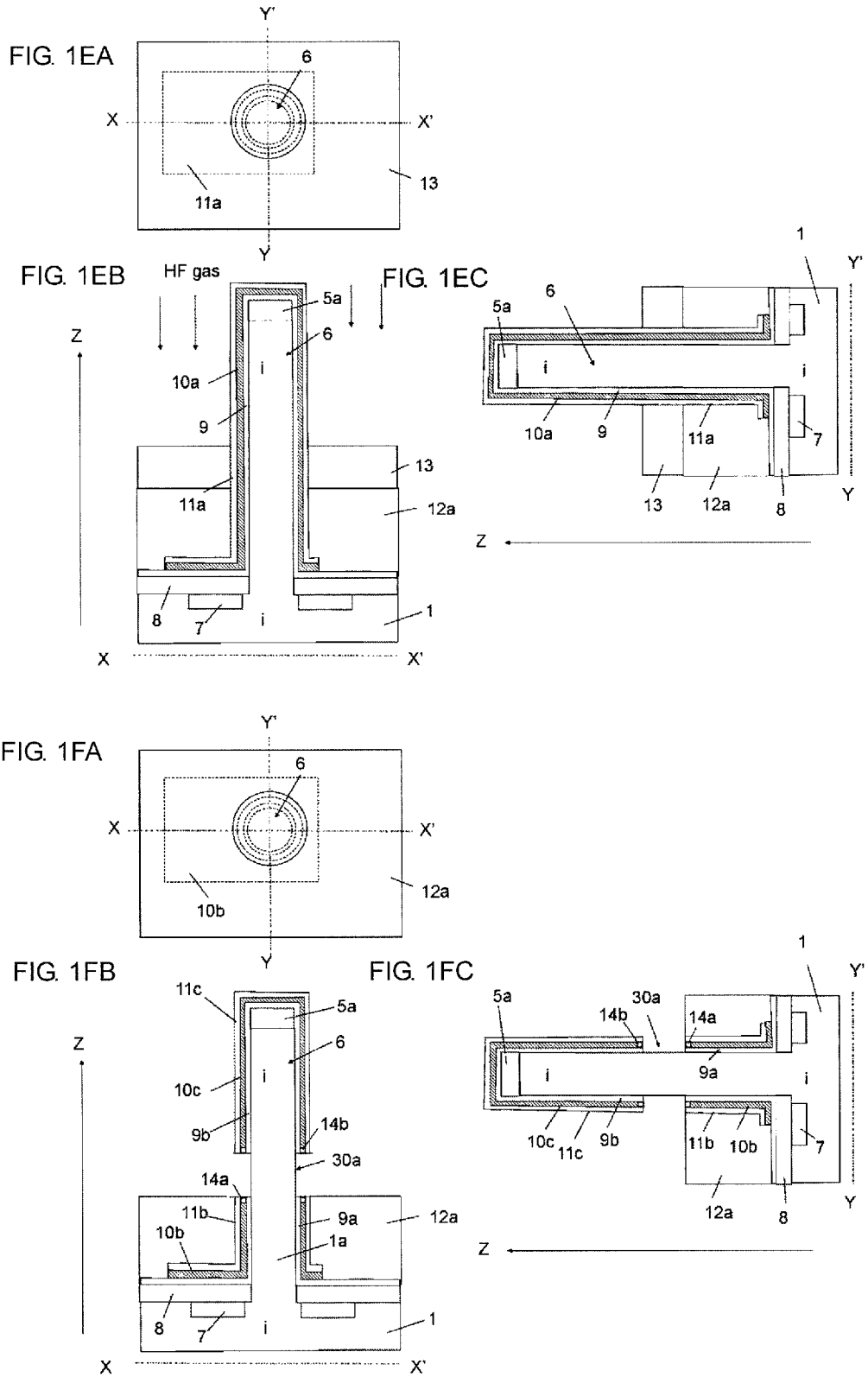

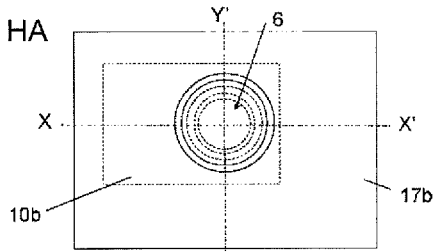
FIG. 1HA
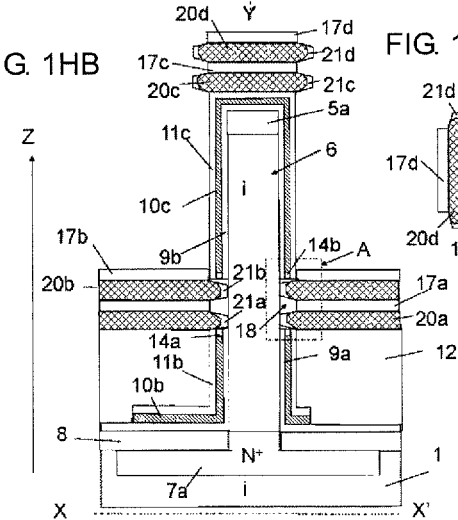
FIG. 1HB
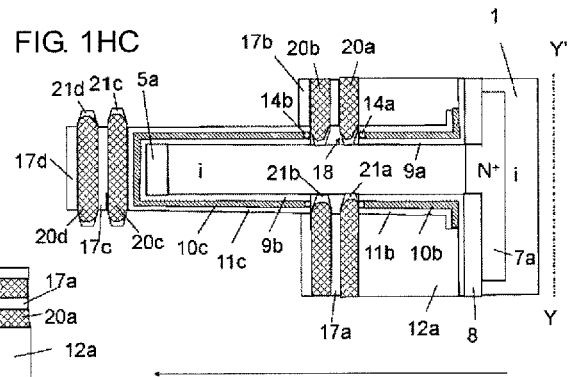
FIG. 1HC
FIG. 1HD
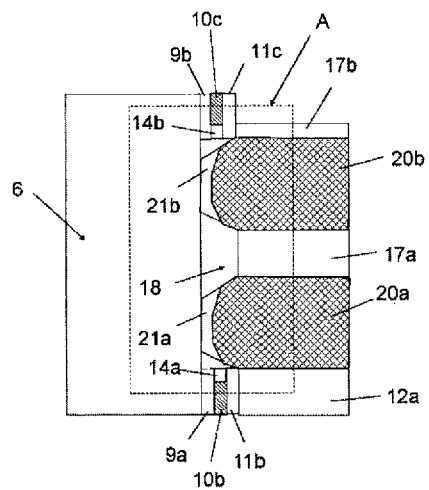

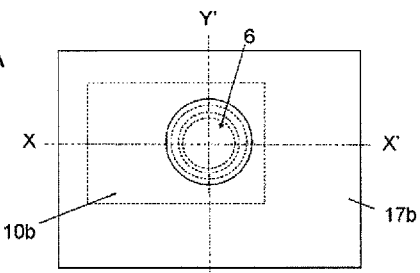
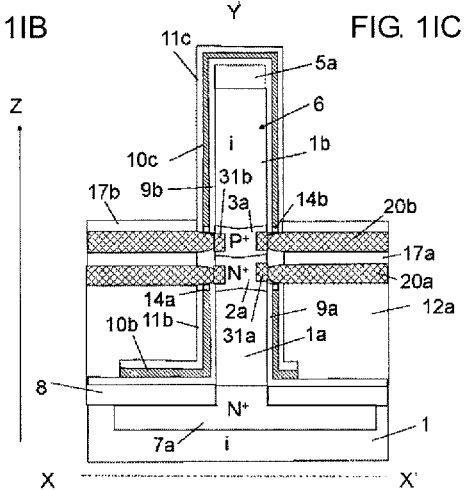
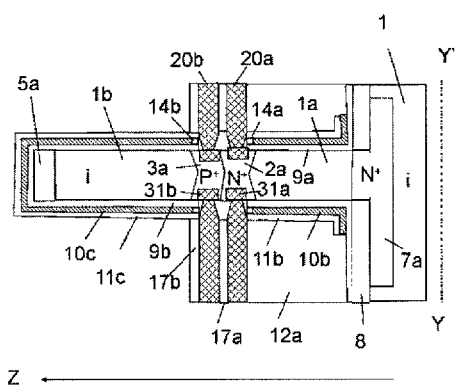
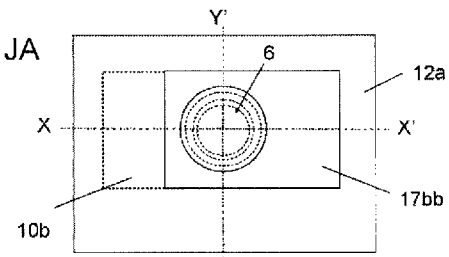
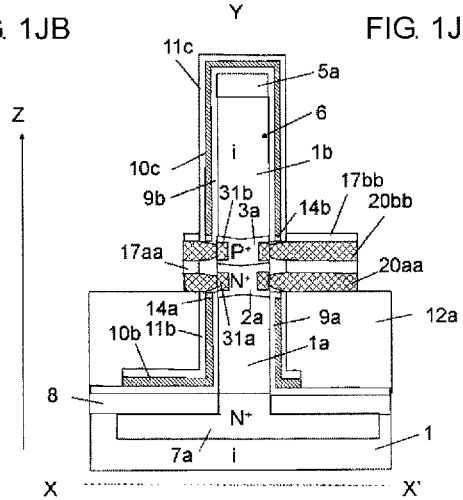
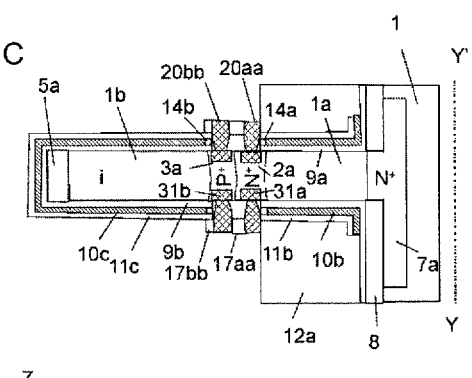

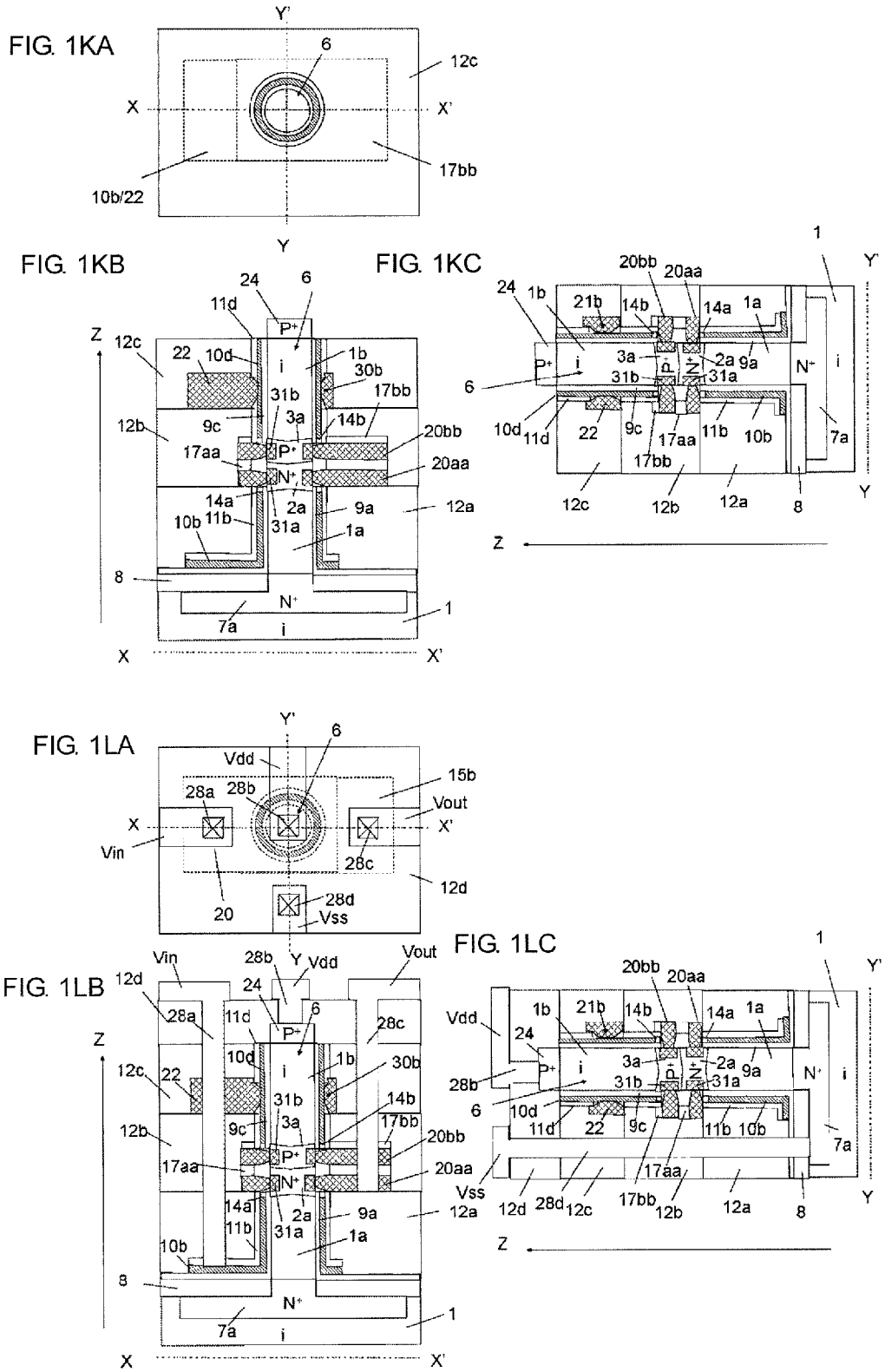

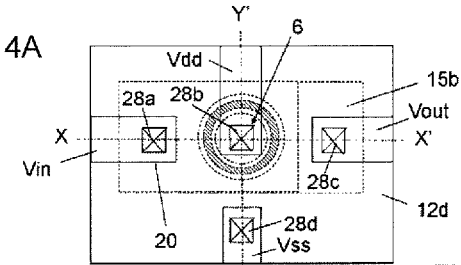
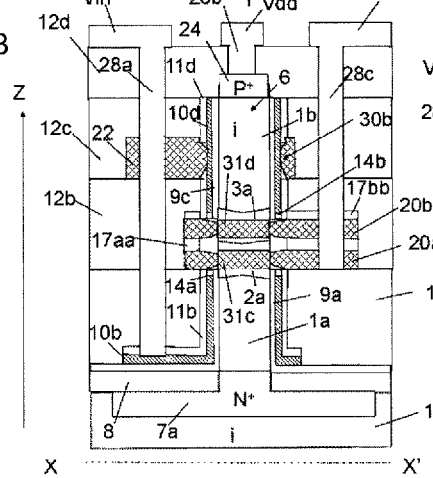
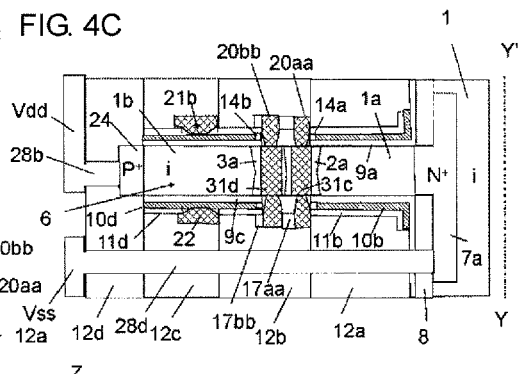
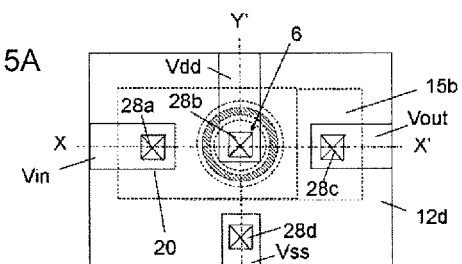
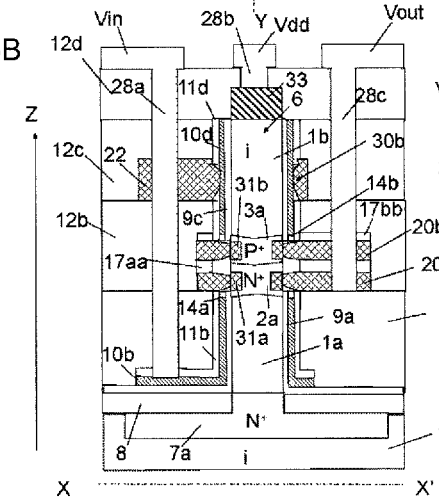
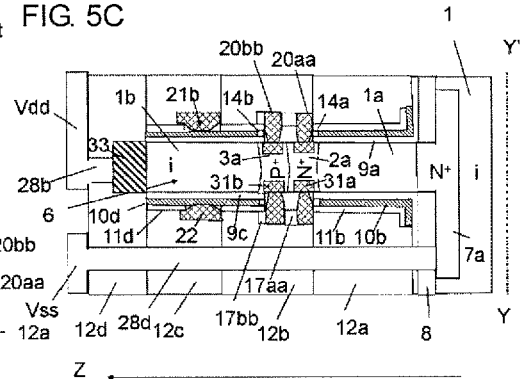

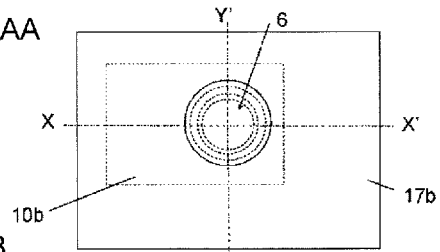
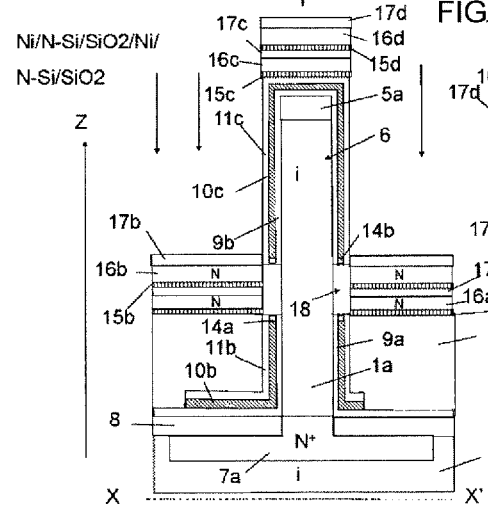
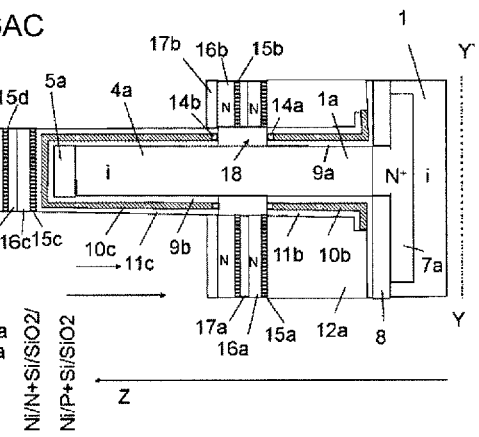
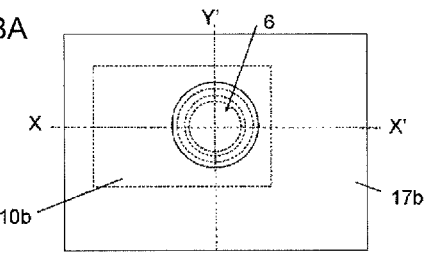
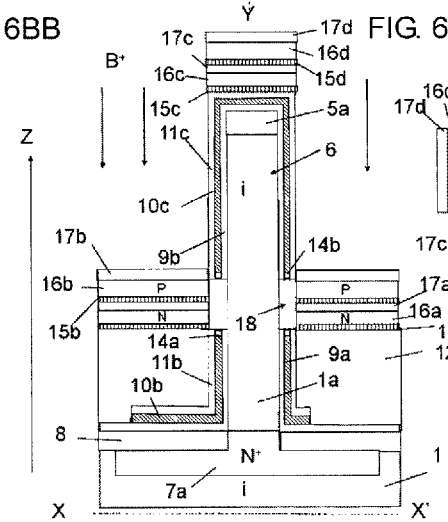

PILLAR-SHAPED SEMICONDUCTOR DEVICE AND METHOD FOR PRODUCING THE SAME

RELATED APPLICATIONS

The present application claims priority to PCT/JP2014/081455, filed Nov. 27, 2014, the entire contents of which are incorporated herein by reference.

BACKGROUND OF THE INVENTION

1. Field of the Invention

The present invention relates to a pillar-shaped semiconductor device and a method for producing the pillar-shaped semiconductor device.

2. Description of the Related Art

In recent years, an SGT (Surrounding Gate MOS Transistor), a representative pillar-shaped semiconductor device, has been attracting attention as a semiconductor element providing a semiconductor device having a high integration degree. There has been a demand for a further increase in the integration degrees of semiconductor devices including SGTs.

In a standard planar MOS transistor, the channel extends in a horizontal direction parallel to the upper surface of the semiconductor substrate. In contrast, the channel of an SGT extends in a direction perpendicular to the upper surface of the semiconductor substrate (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, SGTs allow an increase in the density of semiconductor devices, compared with planar MOS transistors.

FIG. 7 is a schematic structural view of an N channel SGT. A Si pillar 100 (hereafter, a silicon semiconductor pillar will be referred to as a "Si pillar") of P or i (intrinsic) conductivity type has at its upper and lower positions $N^+$ regions 101a and 101b (hereafter, a semiconductor region having a high concentration of donor impurity will be referred to as an "$N^+$ region") in which one of the $N^+$ regions serves as a source and the other one serves as a drain. The Si pillar 100 between the $N^+$ regions 101a and 101b serving as the source and the drain serves as a channel region 102. A gate insulating layer 103 is formed so as to surround the channel region 102. A gate conductor layer 104 is formed so as to surround the gate insulating layer 103. In an SGT, the $N^+$ regions 101a and 101b serving as the source and the drain, the channel region 102, the gate insulating layer 103, and the gate conductor layer 104 are formed within or on the single Si pillar 100. The area of an SGT in plan view corresponds to the area of a single source or drain $N^+$ region in a planar MOS transistor. As a result, compared with circuit chips including planar MOS transistors, further reduction in the size of chips can be achieved in circuit chips including SGTs.

As illustrated in a schematic structural view in FIG. 8, for example, two SGTs 116a and 116b are formed at the upper and lower positions of a single Si pillar 115 to thereby achieve reduction in circuit area.

FIG. 8 is a schematic structural view of a CMOS inverter circuit in which an N channel SGT 116a is formed in a lower portion of the Si pillar 115, and a P channel SGT 116b is formed above this N channel SGT 116a. The Si pillar 115 is formed on an i-layer substrate 117 (hereafter, a semiconductor layer not containing a donor or acceptor impurity will be referred to as an "i-layer") with an $N^+$ region 121a therebetween. A $SiO_2$ layer 118 is formed around the Si pillar 115 and on the i-layer substrate 117 and the $N^+$ region 121a. In an intermediate portion of the Si pillar 115, an $N^+$ region 121b is formed. In the Si pillar 115, a $P^+$ region 122a (hereafter, a semiconductor region having a high concentration of an acceptor impurity will be referred to as a "$P^+$ region") is formed so as to be connected to the $N^+$ region 121b. The top portion of the Si pillar 115 has a $P^+$ region 122b. The $N^+$ region 121a serves as a source of the N channel SGT 16a. The $N^+$ region 121b serves as a drain of the N channel SGT 116a. The Si pillar 115 between the $N^+$ regions 121a and 121b serves as a channel region 123a of the N channel SGT 116a. The $P^+$ region 122b serves as a source of the P channel SGT 116b. The $P^+$ region 122a serves as a drain of the P channel SGT 116b. The Si pillar 115 between the $P^+$ regions 122a and 122b serves as a channel region 123b of the P channel SGT 116b. A gate insulating layer 119a of the N channel SGT 116a is formed so as to surround the channel region 123a. A gate conductor layer 120a of the N channel SGT 16a is formed so as to surround the gate insulating layer 119a. Similarly, a gate insulating layer 119b of the P channel SGT 116b is formed so as to surround the channel region 123b. A gate conductor layer 120b of the P channel SGT 116b is formed so as to surround the gate insulating layer 119b. In a surface layer portion of the $N^+$ region 121a, a nickel silicide layer (NiSi layer) 125a is formed. A NiSi layer 125b is formed around both of the $N^+$ region 121b and the $P^+$ region 122a positioned at a central portion of the Si pillar 115. In an upper surface layer of the $P^+$ region 122b in the top portion of the Si pillar 115, a NiSi layer 125c is formed. A ground wiring metal layer 126a is formed on the NiSi layer 125a. This ground wiring metal layer 126a is connected to a ground terminal VSS. An output wiring metal layer 126b is formed on the NiSi layer 125b. This output wiring metal layer 126b is connected to an output terminal Vo. A power supply wiring metal layer 126c is formed on the NiSi layer 125c. This power supply wiring metal layer 126c is connected to a power supply terminal VDD. Input wiring metal layers 127a and 127b are respectively formed on the gate conductor layers 120a and 120b. These input wiring metal layers 127a and 127b are connected to an input terminal Vi.

In FIG. 8, the NiSi layer 125b, which is connected to the $N^+$ region 121b and the $P^+$ region 122a in the central portion of the Si pillar 115, is formed by forming a nickel (Ni) film on the circumferential surfaces of the $N^+$ region 121b and the $P^+$ region 122a, subsequently carrying out heat treatment at about 450° C., for example, and removing the remaining Ni film on the circumferential surfaces. As a result, the NiSi layer 125b is formed from the circumference to the inside of the $N^+$ region 121b and the $P^+$ region 122a. In a case where the Si pillar 115 has a diameter of 20 nm, for example, the NiSi layer 125b is desirably formed so as to have a thickness of about 5 to about 10 nm in the horizontal direction parallel to the semiconductor substrate. NiSi has a linear expansion coefficient of $12 \times 10^{-6}$/K. Si has a linear expansion coefficient of $2.4 \times 10^{-6}$/K. The linear expansion coefficient of NiSi is about five times that of Si. Because of this large difference in linear expansion coefficient, during production, for example, during heat treatment, the NiSi layer 125b causes high strain due to stress within the Si pillar 115. This tends to result in defects such as bending and collapse of the Si pillar 115. The probability of occurrence of such defects further increases as the diameter of a Si pillar is decreased for the purpose of an increase in the integration degree of circuits, for example. The N+ region 121b and the P+ region 122a need to be formed within the Si pillar 115 with high accuracy with respect to the positions of the gate conductor layers 120a and 120b. In addition, while such problems are considered, the N+ region 121b and the P+ region 122a need to be connected to the output wiring metal layer 126b with certainty. In addition, since processing in the side surface of the Si pillar 115 is carried out, a method of connecting the gate conductor layers 120a and 120b to the input wiring metal layers 127a and 127b with certainty is necessary.

SUMMARY OF THE INVENTION

As described above, in the pillar-shaped semiconductor device including SGTs in FIG. 8, there is a demand for a method that allows accurate and easy formation of the N+ region 121b, the P+ region 122a, the NiSi layer 125b, and the output wiring metal layer 126b in the central portion and in the side surface of the Si pillar 115 without causing bending or collapse of the Si pillar 115.

A pillar-shaped semiconductor device according to a first aspect of the present invention includes a semiconductor pillar that stands on a semiconductor substrate so as to be perpendicular to a surface of the semiconductor substrate; an impurity region formed within the semiconductor pillar and containing donor or acceptor atoms; an alloy layer formed so as to be in contact with a side surface of the impurity region, within the semiconductor pillar and around the semiconductor pillar; and two interlayer insulating layers sandwiching the alloy layer, wherein at least one of the two interlayer insulating layers is separated from a side surface of the semiconductor pillar, the alloy layer contains metal atoms and semiconductor atoms, and the metal atoms react with the semiconductor atoms upon heat treatment to form the alloy layer and, during formation of the alloy layer, the donor or acceptor atoms are pushed out from the alloy layer.

The pillar-shaped semiconductor device preferably includes the semiconductor pillar that stands on the semiconductor substrate so as to be perpendicular to the surface of the semiconductor substrate; a gate insulating layer surrounding the semiconductor pillar; a gate conductor layer surrounding the gate insulating layer; a first interlayer insulating layer surrounding the gate conductor layer, a first impurity region formed under the semiconductor pillar and containing donor or acceptor atoms; a second impurity region positioned above the first impurity region and within the semiconductor pillar and being of the same conductivity type as the first impurity region; the impurity region, which is a third impurity region positioned on or above the second impurity region and within the semiconductor pillar and containing the donor or acceptor atoms; a fourth impurity region positioned above the third impurity region and within the semiconductor pillar and being of the same conductivity type as the third impurity region; a first alloy layer in contact with a side surface of the second impurity region; the alloy layer, which is a second alloy layer in contact with a side surface of the third impurity region; a second interlayer insulating layer that is one of the two interlayer insulating layers, is in contact with an upper surface of the first alloy layer and a lower surface of the second alloy layer, and is separated from the side surface of the semiconductor pillar; and a third interlayer insulating layer that is another one of the two interlayer insulating layers, is on an upper surface of the second alloy layer, and is in contact with a side surface of the first interlayer insulating layer, wherein a first SGT (Surrounding Gate MOS Transistor) is formed in which one of the first impurity region and the second impurity region functions as a source, another one of the first impurity region and the second impurity region functions as a drain, a portion of the semiconductor pillar between the first impurity region and the second impurity region functions as a channel, and the gate conductor layer functions as a gate, and a second SGT is formed in which one of the third impurity region and the fourth impurity region functions as a source, another one of the third impurity region and the fourth impurity region functions as a drain, a portion of the semiconductor pillar between the third impurity region and the fourth impurity region functions as a channel, and the gate conductor layer functions as a gate.

The pillar-shaped semiconductor device preferably further includes a third alloy layer formed within the semiconductor pillar and connecting the second impurity region and the first alloy layer; and a fourth alloy layer formed within the semiconductor pillar and connecting the third impurity region and the second alloy layer.

The third alloy layer and the fourth alloy layer are preferably mutually connected within the semiconductor pillar.

The third alloy layer and the fourth alloy layer are preferably formed so as to extend to a center of the semiconductor pillar in plan view.

The first alloy layer and the second alloy layer are preferably wiring conductor material layers.

The first alloy layer and the second alloy layer are preferably connected via a contact hole extending through both of the first alloy layer and the second alloy layer, to a wiring metal layer formed above the contact hole.

Stress directed downward from the fourth impurity region is preferably produced within the semiconductor pillar.

A space is preferably formed among the first alloy layer, the second alloy layer, and the gate conductor layer.

A method for producing a pillar-shaped semiconductor device according to a second aspect of the present invention includes a semiconductor-pillar formation step of forming a semiconductor pillar that stands on a semiconductor substrate so as to be perpendicular to a surface of the semiconductor substrate; a laminated-structure formation step of stacking a metal layer, a semiconductor layer in contact with the metal layer and containing donor or acceptor atoms, and two interlayer insulating layers sandwiching these layers, in a direction perpendicular to the surface of the semiconductor substrate, such that a side surface of at least one of the two interlayer insulating layers is separated from a side surface of the semiconductor pillar, and the metal layer, the semiconductor layer, and the two interlayer insulating layers are formed so as to surround the semiconductor pillar; an alloy layer-semiconductor pillar side surface contact step of causing a reaction between the metal layer and the semiconductor layer by heat treatment to form an alloy layer, and making the alloy layer protrude toward the side surface of the semiconductor pillar by heat treatment to bring the alloy layer into contact with the side surface of the semiconductor pillar; and an intra-semiconductor pillar alloy layer-impurity region formation step of, after the alloy layer-semiconductor pillar side surface contact step, causing a reaction between metal atoms within the alloy layer and semiconductor atoms in the semiconductor pillar by heat treatment to expand the alloy layer into the semiconductor pillar and to diffuse the donor or acceptor atoms having been pushed out from the alloy layer into the semiconductor pillar to form an impurity region containing the donor or acceptor atoms within the semiconductor pillar.

In the method for producing a pillar-shaped semiconductor device, preferably, after the semiconductor-pillar formation step, a gate insulating layer surrounding the semiconductor pillar is formed, a gate conductor layer surrounding the gate insulating layer is formed, a first interlayer insulating layer surrounding the gate conductor layer is formed, a first impurity region containing donor or acceptor atoms is formed under the semiconductor pillar; in the laminated-structure formation step, a second interlayer insulating layer is formed so as to surround the semiconductor pillar and have an upper surface positioned at an intermediate height of the semiconductor pillar in the perpendicular direction, portions of side surfaces of the first interlayer insulating layer, the gate conductor layer, and the gate insulating layer are removed from an intermediate height of the semiconductor pillar in the perpendicular direction to a lower end at the height of the upper surface of the second interlayer insulating layer, to expose the side surface of the semiconductor pillar, a third interlayer insulating layer is formed so as to cover a surface of the gate conductor layer exposed by the removal, a first metal layer, a first semiconductor layer containing first donor or acceptor atoms, a fourth interlayer insulating layer that is one of the two interlayer insulating layers, the metal layer, which is a second metal layer, the semiconductor layer, which is a second semiconductor layer containing second donor or acceptor atoms, and a fifth interlayer insulating layer that is another one of the two interlayer insulating layers are stacked on the second interlayer insulating layer by directing and depositing material atoms in a direction perpendicular to the surface of the semiconductor substrate such that the first metal layer and the first semiconductor layer are positioned between the second interlayer insulating layer and the fourth interlayer insulating layer, the second metal layer and the second semiconductor layer are positioned between the fourth interlayer insulating layer and the fifth interlayer insulating layer, and the first metal layer, the first semiconductor layer, the fourth interlayer insulating layer, the second metal layer, and the second semiconductor layer are formed so as to be separated from the exposed side surface of the semiconductor pillar; in the alloy layer-semiconductor pillar side surface contact step, heat treatment is carried out to form a first alloy layer formed from metal atoms of the first metal layer and semiconductor atoms of the first semiconductor layer, and a second alloy layer formed from metal atoms of the second metal layer and semiconductor atoms of the second semiconductor layer, to make the first alloy layer and the second alloy layer facing the exposed side surface of the semiconductor pillar protrude toward the exposed side surface of the semiconductor pillar such that a first protrusion formed at a protruding tip of the first alloy layer and having a high content of the first donor or acceptor atoms and a second protrusion formed at a protruding tip of the second alloy layer and having a high content of the second donor or acceptor atoms are brought into contact with the exposed side surface of the semiconductor pillar; in the intra-semiconductor pillar alloy layer-impurity region formation step, the first donor or acceptor atoms in the first protrusion are diffused into the semiconductor pillar to form a second impurity region positioned within the semiconductor pillar and above the first impurity region and being of the same conductivity type as the first impurity region, the second donor or acceptor atoms in the second protrusion are diffused into the semiconductor pillar to form the impurity region, which is a third impurity region on or above the second impurity region, the first alloy layer is expanded into the semiconductor pillar to form a third alloy layer, and the second alloy layer is expanded into the semiconductor pillar to form a fourth alloy layer, the method further includes a fourth-impurity-region formation step of forming a fourth impurity region positioned above the third impurity region and within the semiconductor pillar and being of the same conductivity type as the third impurity region, wherein a first SGT (Surrounding Gate MOS Transistor) is formed in which one of the first impurity region and the second impurity region functions as a source, another one of the first impurity region and the second impurity region functions as a drain, a portion of the semiconductor pillar between the first impurity region and the second impurity region functions as a channel, and the gate conductor layer functions as a gate, and a second SGT is formed in which one of the third impurity region and the fourth impurity region functions as a source, another one of the third impurity region and the fourth impurity region functions as a drain, a portion of the semiconductor pillar between the third impurity region and the fourth impurity region functions as a channel, and the gate conductor layer functions as a gate.

In the intra-semiconductor pillar alloy layer-impurity region formation step, the third alloy layer and the fourth alloy layer are preferably formed so as to be mutually connected.

In the intra-semiconductor pillar alloy layer-impurity region formation step, the third alloy layer and the fourth alloy layer are preferably formed so as to extend to a center of the semiconductor pillar in plan view.

In the laminated-structure formation step, preferably, the first metal layer, a third semiconductor layer not containing donor or acceptor atoms, and the fourth interlayer insulating layer are stacked on the second interlayer insulating layer, ion implantation is carried out to implant the first donor or acceptor atoms into the third semiconductor layer to form the first semiconductor layer, the second metal layer, a fourth semiconductor layer not containing donor or acceptor atoms, and the fifth interlayer insulating layer are stacked on the fourth interlayer insulating layer, and ion implantation is carried out to implant the second donor or acceptor atoms into the fourth semiconductor layer to form the second semiconductor layer.

In the laminated-structure formation step, preferably, the first metal layer, a third semiconductor layer containing the second donor or acceptor atoms, and the fourth interlayer insulating layer are stacked on the second interlayer insulating layer, the second metal layer and the second semiconductor layer are stacked in this order or a reversed order on the fourth interlayer insulating layer, the fifth interlayer insulating layer is stacked on a resultant product, and ion implantation is carried out to implant the first donor or acceptor atoms of a conductivity type opposite to that of the second donor or acceptor atoms, into the third semiconductor layer in an amount larger than an amount of the second donor or acceptor atoms in the third semiconductor layer to form the first semiconductor layer; or the first metal layer and the first semiconductor layer are stacked in this order or a reversed order on the second interlayer insulating layer, the fourth interlayer insulating layer is stacked on a resultant product, the second metal layer and a fourth semiconductor layer containing the first donor or acceptor atoms are stacked in this order or a reversed order on the fourth interlayer insulating layer, the fifth interlayer insulating layer is stacked on a resultant product, and ion implantation is carried out to implant the second donor or acceptor atoms of a conductivity type opposite to that of the first donor or acceptor atoms, into the fourth semiconductor layer in an amount larger than an amount of the first donor or acceptor atoms in the fourth semiconductor layer to form the second semiconductor layer.

The method for producing a pillar-shaped semiconductor device preferably further includes a contact-hole formation step of forming a contact hole so as to extend through both of the first alloy layer and the second alloy layer, and a wiring-metal-layer formation step of forming a wiring metal layer electrically connected via the contact hole to the first alloy layer and the second alloy layer.

The fourth impurity region is preferably formed so as to produce stress directed downward in the semiconductor pillar.

A space is preferably formed among the first alloy layer, the second alloy layer, and the gate conductor layer.

According to the present invention, in a semiconductor device including an SGT, a semiconductor region that serves as the source or drain of the SGT in the central portion of a semiconductor pillar can be formed with high accuracy with respect to the position of a gate conductor layer. According to the present invention, in a semiconductor device including an SGT, occurrence of bending or collapse of a semiconductor pillar is suppressed during formation of an alloy layer within a semiconductor region being present in the central portion of the semiconductor pillar and serving as the source or drain of the SGT, and the connection between the semiconductor region and a wiring metal layer connected to the alloy layer can be established with certainty.

BRIEF DESCRIPTION OF THE DRAWINGS

FIGS. 1EA, 1EB, and 1EC are respectively a plan view and sectional structural views of a CMOS inverter circuit for explanation of a method for producing a semiconductor device including an SGT according to the first embodiment.

FIGS. 1FA, 1FB, and 1FC are respectively a plan view and sectional structural views of a CMOS inverter circuit for explanation of a method for producing a semiconductor device including an SGT according to the first embodiment.

FIGS. 1HA, 1HB, 1HC, and 1HD are respectively a plan view, sectional structural views, and an enlarged sectional view of a CMOS inverter circuit for explanation of a method for producing a semiconductor device including an SGT according to the first embodiment.

FIGS. 1IA, 1IB, and 1IC are respectively a plan view and sectional structural views of a CMOS inverter circuit for explanation of a method for producing a semiconductor device including an SGT according to the first embodiment.

FIGS. 1JA, 1JB, and 1JC are respectively a plan view and sectional structural views of a CMOS inverter circuit for explanation of a method for producing a semiconductor device including an SGT according to the first embodiment.

FIGS. 1KA, 1KB, and 1KC are respectively a plan view and sectional structural views of a CMOS inverter circuit for explanation of a method for producing a semiconductor device including an SGT according to the first embodiment.

FIGS. 1LA, 1LB, and 1LC are respectively a plan view and sectional structural views of a CMOS inverter circuit for explanation of a method for producing a semiconductor device including an SGT according to the first embodiment.

FIGS. 4A, 4B, and 4C are respectively a plan view and sectional structural views of a CMOS inverter circuit for explanation of a method for producing a semiconductor device including an SGT according to a fourth embodiment of the present invention.

FIGS. 5A, 5B, and 5C are respectively a plan view and sectional structural views of a CMOS inverter circuit for explanation of a semiconductor device including an SGT according to a fifth embodiment of the present invention.

FIGS. 6AA, 6AB, and 6AC are respectively a plan view and sectional structural views of a CMOS inverter circuit for explanation of a method for producing a semiconductor device including an SGT according to a sixth embodiment of the present invention.

FIGS. 6BA, 6BB, and 6BC are respectively a plan view and sectional structural views of a CMOS inverter circuit for explanation of a method for producing a semiconductor device including an SGT according to the sixth embodiment.

DETAILED DESCRIPTION OF THE PREFERRED EMBODIMENTS

Hereinafter, a method for producing a pillar-shaped semiconductor device including an SGT according to an embodiment of the present invention will be described with reference to drawings.

First Embodiment

Hereinafter, a method for producing a CMOS inverter circuit including an SGT according to a first embodiment of the present invention will be described with reference to FIG. 1AA to FIG. 1LC.

Figure 1A:
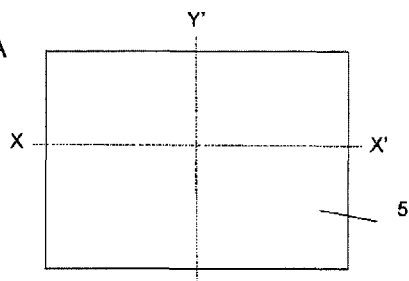
FIGS. 1AA, 1AB, and 1AC are respectively a plan view and sectional structural views of a CMOS inverter circuit for explanation of a method for producing a semiconductor device including an SGT according to a first embodiment of the present invention.
Figure 1A:
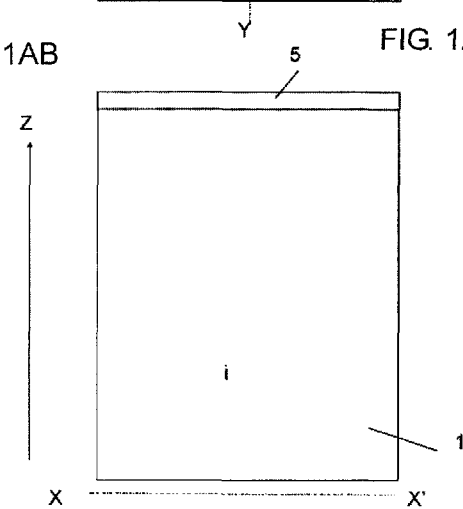
Figure 1A:
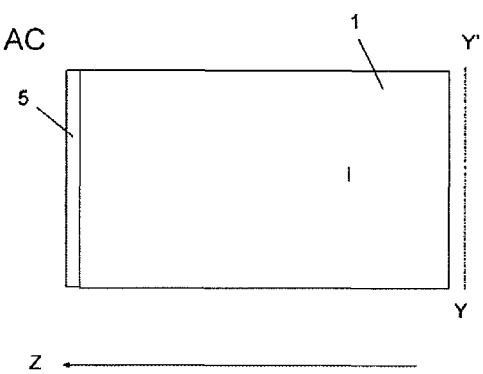

FIGS. 1AA to 1AC are a plan view and sectional views for explanation of a first production step of a CMOS inverter circuit including an SGT: FIG. 1AA is the plan view, FIG. 1AB is a sectional structural view taken along line X-X' in FIG. 1AA, and FIG. 1AC is a sectional structural view taken along line Y-Y' in FIG. 1AA. Regarding numbering of these drawings, the same relationship among the suffixes A, B, and C applies to other drawings that will be referred to below.

As illustrated in FIGS. 1AA to 1AC, a $SiO_2$ layer 5 is formed by thermal oxidation on an i-layer substrate 1.

Figure 1B:
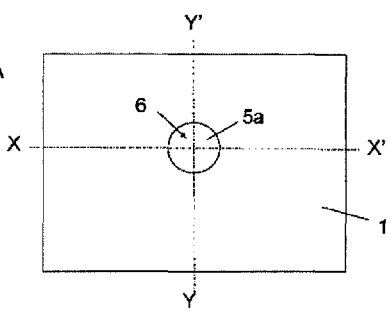
FIGS. 1BA, 1BB, and 1BC are respectively a plan view and sectional structural views of a CMOS inverter circuit for explanation of a method for producing a semiconductor device including an SGT according to the first embodiment.
Figure 1B:
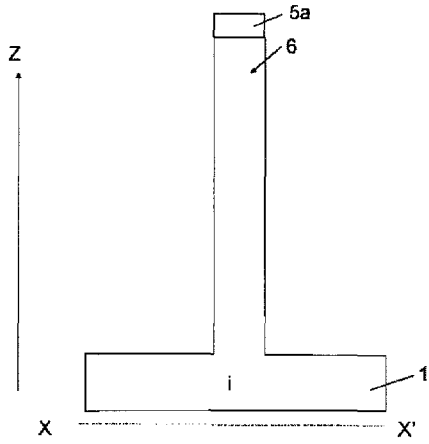
Figure 1B:
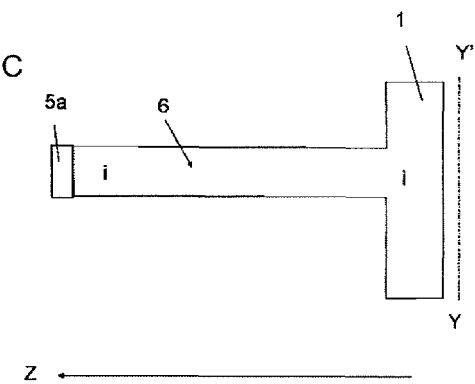

Subsequently, as illustrated in FIGS. 1BA to 1BC, the $SiO_2$ layer 5 is etched by lithography and RIE (Reactive Ion Etching) to thereby form a $SiO_2$ layer 5a. In addition, RIE using the $SiO_2$ layer 5a as a mask is carried out to etch the i-layer substrate 1 to thereby form a Si pillar 6 extending in a direction perpendicular to (up and down with respect to) the surface of the i-layer substrate 1. The cross-sectional shape of the Si pillar 6 is, as illustrated in FIG. 1BA, preferably circular. The side surface of the Si pillar 6 preferably forms substantially a right angle with the upper surface of the i-layer substrate 1.

Figure 1C:
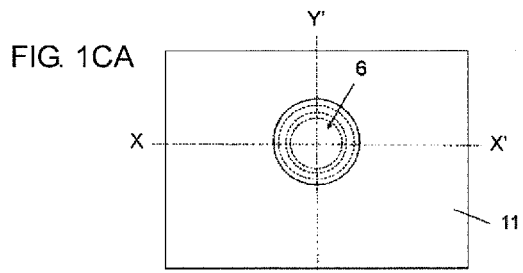
FIGS. 1CA, 1CB, and 1CC are respectively a plan view and sectional structural views of a CMOS inverter circuit for explanation of a method for producing a semiconductor device including an SGT according to the first embodiment.
Figure 1C:
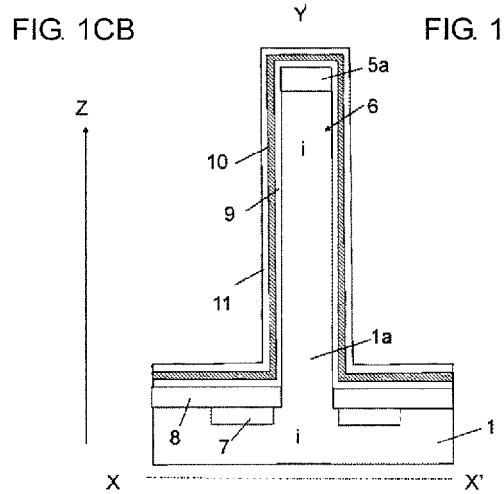
Figure 1C:
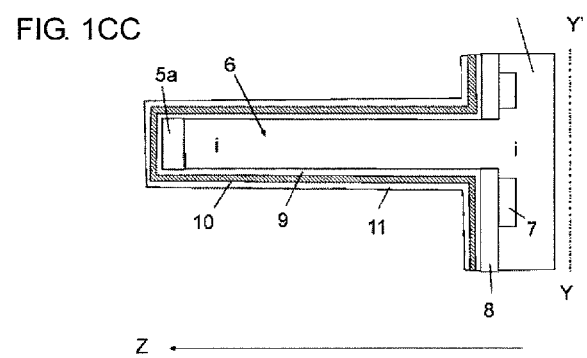

Subsequently, as illustrated in FIGS. 1CA to 1CC, an $N^+$ region 7 is formed by ion implantation in a surface layer of the i-layer substrate 1 so as to surround the Si pillar 6. Subsequently, a $SiO_2$ film (not shown) is deposited by CVD (Chemical Vapor Deposition). The upper surface of the $SiO_2$ film is planarized by MCP (Mechanical Chemical Polishing) and the $SiO_2$ film is subsequently etched by an etch back process. As a result, a $SiO_2$ layer 8 is left on the i-layer substrate 1 and the $N^+$ region 7 so as to surround the Si pillar 6. Subsequently, the Si pillar 6 and the $SiO_2$ layer 8 are entirely covered with a hafnium oxide ($HfO_2$) layer 9 by ALD (Atomic Layer Deposition) and further covered with titanium nitride (TiN) layer 10. After that, the Si pillar 6 and the region surrounding the Si pillar 6 are entirely covered with a $SiO_2$ layer 11 by CVD. Finally, the $HfO_2$ layer 9 serves as a gate insulating layer of an SGT and the TiN layer 10 serves as a gate conductor layer of the SGT.

Figure 1D:
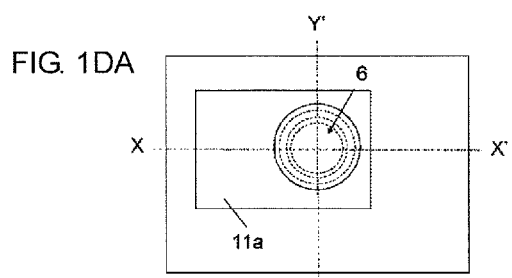
FIGS. 1DA, 1DB, and 1DC are respectively a plan view and sectional structural views of a CMOS inverter circuit for explanation of a method for producing a semiconductor device including an SGT according to the first embodiment.
Figure 1D:
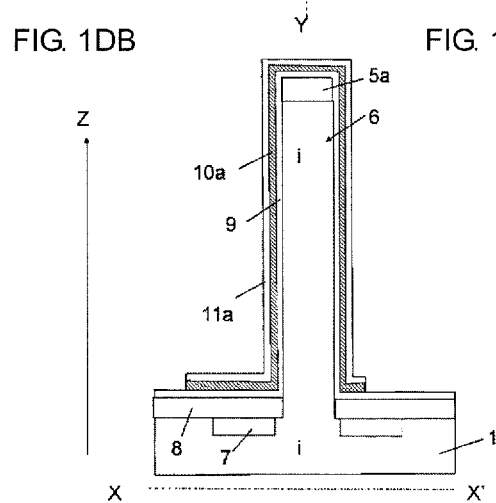
Figure 1D:
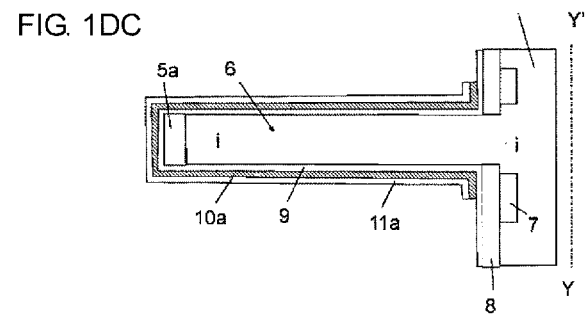

Subsequently, while a resist layer formed by lithography is used as a mask, as illustrated in FIGS. 1DA to 1DC, the $SiO_2$ layer 11 and the TiN layer 10 are etched by RIE, to thereby provide a $SiO_2$ layer 11a and a TiN layer 10a, which extend from the upper surface of the Si pillar 6 to the upper surface of the $SiO_2$ layer 8.

Subsequently, as illustrated in FIGS. 1EA to 1EC, a silicon nitride (SiN) layer 12a is formed so as to surround the Si pillar 6. Subsequently, a resist layer 13 is formed on the SiN layer 12a. The resist layer 13 is formed in the following manner: a resist material is applied to the whole upper surface of the i-layer substrate 1; a heat treatment at 200° C., for example, is subsequently carried out to increase the flowability of the resist material; and the resist material is left at rest on the SiN layer 12a surrounding the Si pillar 6 until the resist material forms a flat layer. Subsequently, hydrogen fluoride gas (hereafter, referred to as "HF gas") is supplied to the whole structure. Subsequently, heating is carried out at 180° C., for example, to cause electrolytic dissociation of HF gas with moisture contained within the resist layer 13 to thereby form hydrogen fluoride ions ($HF_2^+$) (hereafter, referred to as "HF ions"). These HF ions diffuse through the resist layer 13 and etch a portion of the $SiO_2$ layer 11a that is in contact with the resist layer 13 (regarding the mechanism of this etching, refer to Tadashi Shibata, Susumu Kohyama and Hisakazu Iizuka: "A New Field Isolation Technology for High Density MOS LSI", Japanese Journal of Applied Physics, Vol. 18, pp. 263-267 (1979)). On the other hand, a portion of the $SiO_2$ layer 11a that is not in contact with the resist layer 13 is substantially left without being etched off. After that, the resist layer 13 is removed.

As a result of this process, as illustrated in FIGS. 1FA to 1FC, the $SiO_2$ layer 11a is divided into a $SiO_2$ layer 11b, which is a region covered with the SiN layer 12a, and a $SiO_2$ layer 11c, which is an upper region on the Si pillar 6. Subsequently, while the $SiO_2$ layers 11b and 11c are used as masks, the TiN layer 10a is etched to thereby divide the TiN layer 10a into a TiN layer 10b, which is a lower region disposed on the Si pillar 6 and covered with the $SiO_2$ layer 11b, and a TiN layer 10c, which is an upper region disposed on the Si pillar 6 and covered with the $SiO_2$ layer 11c. Subsequently, while the $SiO_2$ layers 11b and 11c and the TiN layers 10b and 10c are used as masks, the $HfO_2$ layer 9 is etched to thereby divide the $HfO_2$ layer 9 into a $HfO_2$ layer 9a, which is a lower region disposed on the Si pillar 6 and partially covered with the TiN layer 10b, and a $HfO_2$ layer 9b, which is an upper region disposed on the Si pillar 6 and covered with the TiN layer 10c. As a result, an opening 30a is formed in the side surface of the Si pillar 6. After that, exposed portions of the TiN layers 10b and 10c are oxidized to form TiO (titanium oxide) layers 14a and 14b.

Figure 1G:
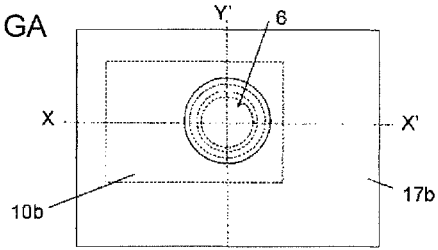
FIGS. 1GA, 1GB, 1GC, and 1GD are respectively a plan view, sectional structural views, and an enlarged sectional view of a CMOS inverter circuit for explanation of a method for producing a semiconductor device including an SGT according to the first embodiment.
Figure 1G:
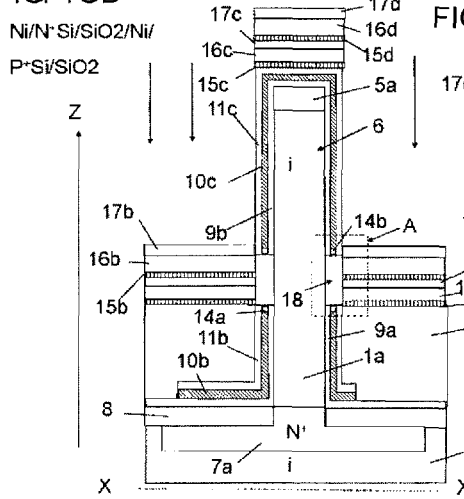
Figure 1G:
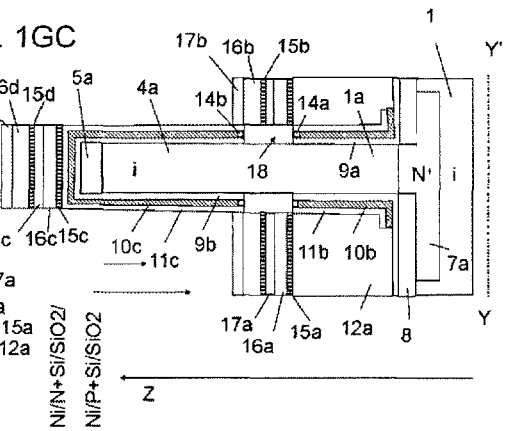
Figure 1G:
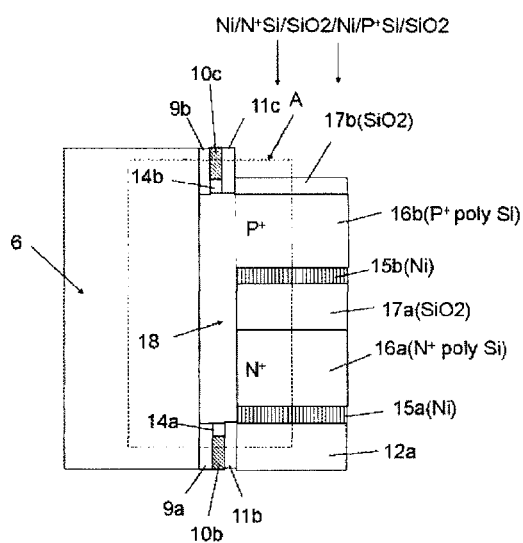

Subsequently, as illustrated in FIGS. 1GA to 1GC, As atoms in the $N^+$ region 7 are diffused into the i-layer substrate by heat treatment to form an $N^+$ region 7a. Subsequently, the following bias sputtering is carried out, for example: a substrate metal plate on which the i-layer substrate 1 is placed and a counter metal plate are prepared such that the counter metal plate is separated from the substrate metal plate; a direct voltage is applied to the substrate metal plate and a RF high-frequency voltage is applied to these two parallel metal plates to thereby sputter material atoms from the counter metal plate and to deposit the atoms onto the i-layer substrate 1. In this way, Ni atoms are directed in a direction perpendicular to the upper surface of the i-layer substrate 1 to thereby form a Ni layer 15a on the SiN layer 12a and to form a Ni layer 15c on the Si pillar 6. Subsequently, bias sputtering is carried out to form a poly-Si layer 16a containing arsenic (As) impurity on the Ni layer 15a and to form a poly-Si layer 16c containing arsenic (As) atoms serving as a donor impurity on the Ni layer 15c. Subsequently, bias sputtering is carried out to direct $SiO_2$ atoms in a direction perpendicular to the upper surface of the i-layer substrate 1 to thereby form a $SiO_2$ layer 17a on the poly-Si layer 16a and to form a $SiO_2$ layer 17c on the poly-Si layer 16c. The process used for forming the Ni layer 15a, the poly-Si layer 16a, and the $SiO_2$ layer 17a is similarly used to form a Ni layer 15b, a poly-Si layer 16b containing boron (B) atoms serving as an acceptor impurity, and a $SiO_2$ layer 17b on the $SiO_2$ layer 17a and to form a Ni layer 15d, a poly-Si layer 16d containing boron (B) atoms, and a $SiO_2$ layer 17d on the $SiO_2$ layer 17c.

The Ni atoms, the poly-Si atoms, and the $SiO_2$ atoms are directed in a direction perpendicular to the upper surface of the i-layer substrate 1. As a result, a space 18 is generated between the circumferential side surface of the Si pillar 6 and the Ni layers 15a and 15b, the poly-Si layers 16a and 16b, and the $SiO_2$ layers 17a and 17b.

FIG. 1GD is an enlarged view of a dotted rectangle A in FIG. 1GB. The $SiO_2$ layer 17b is formed such that the upper surface thereof is positioned at a level higher than the upper end of the space 18. The $SiO_2$ layer 17b is in contact with the $SiO_2$ layer 11c. Thus, the space 18 is formed as a closed space.

Subsequently, as illustrated in FIGS. 1HA to 1HC, a heat treatment at 550° C., for example, is carried out to diffuse Ni atoms in the Ni layers 15a and 15b into the poly-Si layers 16a and 16b to thereby form nickel silicide (NiSi) layers 20a and 20b. The NiSi layers 20a and 20b are expanded in volume relative to the poly-Si layers 16a and 16b (regarding this expansion in volume, refer to T. Morimoto, T. Ohguro, H. Sasaki, M. S. Momose, T. Iinuma, I. Kunishima, K. Suguro, 1. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). The poly-Si layer 16a is sandwiched between the SiN layer 12a and the $SiO_2$ layer 17a. The poly-Si layer 16b is sandwiched between the $SiO_2$ layers 17a and 17b. Accordingly, the NiSi layers 20a and 20b mainly expand into the space 18. As atoms contained in the poly-Si layer 16a and B atoms contained in the poly-Si layer 16b are pushed outside the NiSi layers 20a and 20b (regarding this push-out phenomenon, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). As a result of this impurity-atom push-out effect, during formation of the NiSi layers 20a and 20b, protrusions 21a and 21b containing large amounts of impurity atoms are formed in the surface layers of side surfaces of the NiSi layers 20a and 20b protruding into the space 18; and, finally, the side surfaces of the protrusions 21a and 21b come into contact with the surface of the Si pillar 6. During the above-described process, NiSi layers 20c and 20d and their protrusions 21c and 21d are simultaneously formed on the Si pillar 6 from the Ni layers 15c and 15d and the poly-Si layers 16c and 16d. After that, the NiSi layers 20c and 20d, the protrusions 21c and 21d, and the $SiO_2$ layers 17c and 17d on the Si pillar 6 are removed.

FIG. 1HD is an enlarged view of a dotted rectangle A in FIG. 1HB. The side surface of the protrusion 21a containing a large amount of As atoms serving as a donor impurity and the side surface of the protrusion 21b containing a large amount of B atoms serving as an acceptor impurity are in contact with the side surface of the Si pillar 6. The $SiO_2$ layer 17b is formed such that the upper surface thereof is at a level higher than the upper end of the space 18. Thus, the NiSi layer 20a is sandwiched between the SiN layer 12a and the $SiO_2$ layer 17a; and the NiSi layer 20b is sandwiched between the $SiO_2$ layers 17a and 17b.

Subsequently, as illustrated in FIGS. 1IA to 1IC, heat treatment is carried out to promote silicide formation for the NiSi layers 20a and 20b and to cause diffusion of As atoms and B atoms from the protrusions 21a and 21b into the Si pillar due to the impurity push-out effect. In the surface layer of the side surface of the Si pillar 6 in contact with the NiSi layers 20a and 20b, NiSi layers 31a and 31b are formed and As atoms and B atoms are diffused into the Si pillar 6 by the impurity push-out effect. Thus, an $N^+$ region 2a and a $P^+$ region 3a are formed.

Subsequently, as illustrated in FIGS. 1JA to 1JC, the NiSi layers 20a and 20b and the $SiO_2$ layers 17a and 17b are patterned by lithography and RIE to thereby provide NiSi layers 20aa and 20bb and $SiO_2$ layers 17aa and 17bb.

Subsequently, as illustrated in FIGS. 1KA to 1KC, the process used for forming the SiN layer 12a is similarly used to form a SiN layer 12b such that the upper surface thereof is at an intermediate level relative to the height of the TiN layer 10c. Subsequently, the process used for forming the opening 30a is similarly used to form an opening 30b around the TiN layer 10c. Subsequently, a NiSi layer 22 is formed so as to be in contact with the TiN layer 10c. Subsequently, a $SiO_2$ film 12c is formed by CVD over the entire structure such that the upper surface thereof is at a level higher than the surface of the NiSi layer 22 and lower than the top of the Si pillar 6. After that, while the $SiO_2$ layer 12c is used as a mask, the $SiO_2$ layer 11c, the TiN layer 10c, and the $HfO_2$ layer 9b are etched to thereby provide a $SiO_2$ layer 11d, a TiN layer 10d, and a $HfO_2$ layer 9c. Subsequently, while the $SiO_2$ layers 11d and 12c, the TiN layer 10d, and the $HfO_2$ layer 9c are used as masks, boron (B) ions are implanted to form a $P^+$ region 24 at the top of the Si pillar 6.

Subsequently, as illustrated in FIGS. 1LA to 1LC, a $SiO_2$ layer 12d is formed over the entire structure by CVD and MCP. Subsequently, lithography and RIE are used to form a contact hole 28a so as to extend through the NiSi layer 22 to the TiN layer 10b, to form a contact hole 28b so as to extend to the top of the Si pillar 6, to form a contact hole 28c so as to extend through the $SiO_2$ layer 17bb, the NiSi layer 20bb, the $SiO_2$ layer 17aa, and the NiSi layer 20aa, and to form a contact hole 28d so as to extend to the $N^+$ region 7a. Subsequently, an input wiring metal layer Vin is formed so as to be electrically connected via the contact hole 28a to the NiSi layer 22 and the TiN layer 10b; and a power supply wiring metal layer Vdd is formed so as to be electrically connected via the contact hole 28b to the $P^+$ region 24 at the top of the Si pillar 6. An output wiring metal layer Vout is formed so as to be electrically connected via the contact hole 28c to the NiSi layers 20aa and 20bb; and a ground wiring metal layer Vss is formed so as to be electrically connected via the contact hole 28d to the $N^+$ region 7b.

The above-described production method provides a CMOS inverter circuit including an N channel SGT and a P channel SGT. The N channel SGT includes the i-layer 1a, which is in a lower region of the Si pillar 6 and functions as a channel; the $HfO_2$ layer 9a, which surrounds the i-layer 1a and functions as a gate insulating layer; the TiN layer 10b, which surrounds the $HfO_2$ layer 9a and functions as a gate conductor layer; the $N^+$ region 7a, which is positioned under the i-layer 1a and functions as source; and the $N^+$ region 2a, which is positioned on the i-layer 1a and functions as a drain. The P channel SGT includes the i-layer 1b, which is in an upper region of the Si pillar 6 and functions as a channel; the $HfO_2$ layer 9c, which surrounds the i-layer 1b and functions as a gate insulating layer; the TiN layer 10d, which surrounds the $HfO_2$ layer 9c and functions as a gate conductor layer; the $P^+$ region 3a, which is positioned below the i-layer 1b and functions as a drain; and the $P^+$ region 24, which is positioned on the i-layer 1b and functions as a source.

In the step illustrated in FIGS. 1HA to 1HD, the NiSi layers 20a and 20b expand into the space 18 and the protrusions 21a and 21b containing large amounts of donor or acceptor impurity atoms are connected to the side surface of the Si pillar 6. Alternatively, these expansion and connection may be performed in another step after the step in FIGS. 1HA to 1HD as long as the structure illustrated in FIGS. 1KA to 1KC is provided. For example, the expansion and connection may be performed in the step illustrated in FIGS. 1IA to 1IC.

As illustrated in FIGS. 11B and 11C, the NiSi layers 20aa and 20bb are preferably separated from the TiO layers 14a and 14b, which are formed by oxidizing the exposed portions of the TiN layers 10b and 10d. In this case, the presence of spaces (air layers) between the NiSi layers 20aa and 20bb and the TiN layers 10b and 10d further enhances insulation between the NiSi layers 20aa and 20bb and the TiN layers 10b and 10d. The TiO layers 14a and 14b may be omitted. In this case, spaces (air layers) are preferably formed between the NiSi layers 20aa and 20bb and the TiN layers 10b and 10d.

In order to enhance insulation, additional insulating layers may be formed on the end surfaces of the TiN layers 10b and 10d. For example, in the step illustrated in FIGS. 1FA to 1FC, after the opening 30a is formed in the side surface of the Si pillar 6, the exposed portion in the side surface of the Si pillar 6 and the entire structure may be covered with an additional insulating layer, for example, with a SiN layer and a $SiO_2$ layer by ALD, and a process similar to that used for forming the opening 30a may be used to form an opening. In such a case where an additional insulating layer is formed, in the step illustrated in FIGS. 1HA to 1HD, the $SiO_2$ layer 17a and the additional insulating layer sandwich the NiSi layer 20a therebetween; the $SiO_2$ layer 17a is separated from the side surface of the Si pillar 6; and the additional insulating layer is in contact with the side surface of the Si pillar 6.

In the step illustrated in FIGS. 1IA to 1IC, formation of the $N^+$ region 2a and the $P^+$ region 3a is achieved by a single heat treatment. Alternatively, instead of formation of the $N^+$ region 2a and the $P^+$ region 3a by a single heat treatment, in the steps illustrated in FIG. 1IA to FIG. 1LC, a plurality of heat treatments may be carried out to form the $N^+$ region 2a and the $P^+$ region 3a by the final production step for SGTs.

The method for producing a CMOS inverter circuit according to the first embodiment provides the following advantages.

1. As illustrated in FIGS. 11B and 11C, the $N^+$ region 2a is formed with the NiSi layer 20a serving as a diffusion source of the donor impurity As atoms, the NiSi layer 20a having a lower end positioned at the upper end of the TiN layer 10b serving as the gate of the lower SGT. Thus, in the lower SGT, the drain $N^+$ region 2a and the gate TiN layer 10b are formed by self alignment. Similarly, the P+ region 3a is formed with the NiSi layer 20b serving as a diffusion source of the acceptor impurity B atoms, the NiSi layer 20b having an upper surface positioned at the lower end of the TiN layer 10c serving as the gate of the upper SGT. Thus, in the upper SGT, the drain $P^+$ region 3a and the gate TiN layer 10c are formed by self alignment. The two self-alignment formations of the drains $N^+$ region 2a and $P^+$ region 3a and the gates TiN layers 10b and 10c are simultaneously achieved. This leads to a decrease in the capacitance between the drain $N^+$ region 2a and the gate TiN layer 10b and between the drain $P^+$ region 3a and the gate TiN layer 10c and reduction in variations in SGT characteristics.

2. In the inverter circuit, the drain N+ region 2a and P+ region 3a, which are formed so as to be in contact with each other, are formed not separately but simultaneously. This leads to cost reduction in the production of ICs (Integrated Circuits) including an SGT inverter circuit. In addition, such formation of the drain N+ region 2a and P+ region 3a at accurate relative positions advantageously allows formation of inverter circuits having reduced variations in performance.

3. The NiSi layers 20a and 20b, which are impurity diffusion sources for forming the drain N+ region 2a and P+ region 3a, themselves serve as lead wiring material layers for the drain N+ region 2a and P+ region 3a. This leads to cost reduction in the production of ICs including an SGT inverter circuit.

4. The NiSi layers 20a, 20b, 20aa, and 20bb are present from the step of forming the NiSi layers 31a and 31b within the Si pillar 6 to subsequent steps and play the role of suppressing collapse or bending of the Si pillar 6.

5. The contact hole 28c is formed so as to extend through the NiSi layer 20aa, the $SiO_2$ layer 17aa, and the NiSi layer 20bb. The output wiring metal layer Vout is formed in the contact hole 28c. As a result, in plan view, the NiSi layers 20aa and 20bb are mutually connected via a single contact hole, the contact hole 28c. This leads to reduction in the area of IC chips on which SGT inverter circuits are mounted and reduction in the production cost.

6. Spaces (air layers) are present between the NiSi layers 20aa and 20bb and the TiN layers 10b and 10d. This further enhances insulation between the NiSi layers 20aa and 20bb and the TiN layers 10b and 10d.

Second Embodiment

Hereinafter, referring to FIG. 2AA to FIG. 2B, a method for producing a CMOS inverter circuit including an SGT according to a second embodiment of the present invention will be described. The CMOS inverter circuit according to the second embodiment is produced by the same steps as those illustrated in FIG. 1AA to FIG. 1LC in the first embodiment except for the following difference in the structure.

Figure 2A:
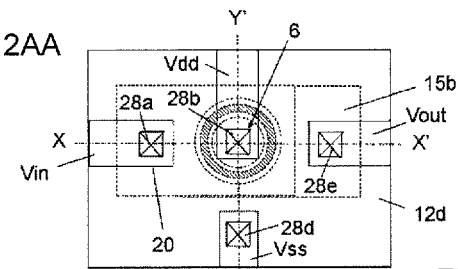
FIGS. 2AA, 2AB, and 2AC are respectively a plan view and sectional structural views of a CMOS inverter circuit for explanation of a method for producing a semiconductor device including an SGT according to a second embodiment of the present invention.
Figure 2A:
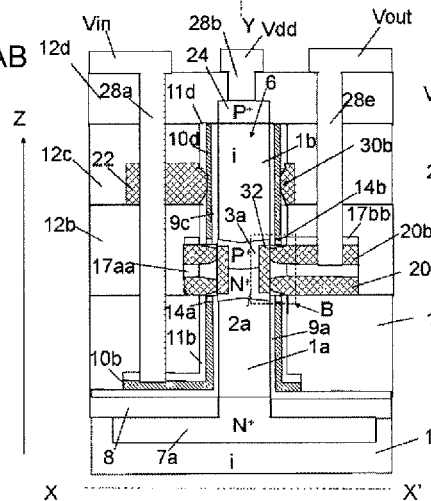
Figure 2A:
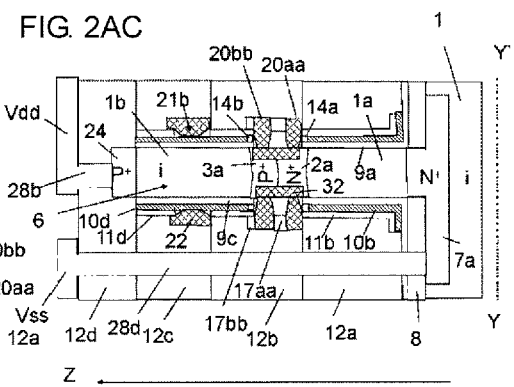

In this embodiment, instead of the NiSi layers 31a and 31b, as illustrated in FIGS. 2AB and 2AC, a NiSi layer 32 connected to the side surfaces of the NiSi layers 20aa and 20bb is formed in the side surface of the Si pillar 6. A contact hole 28e is formed such that the bottom surface thereof is at the surface of the $SiO_2$ layer 17aa. The contact hole 28e is used to mutually connect the output wiring metal layer Vout and the NiSi layer 20bb.

Figure 2B:
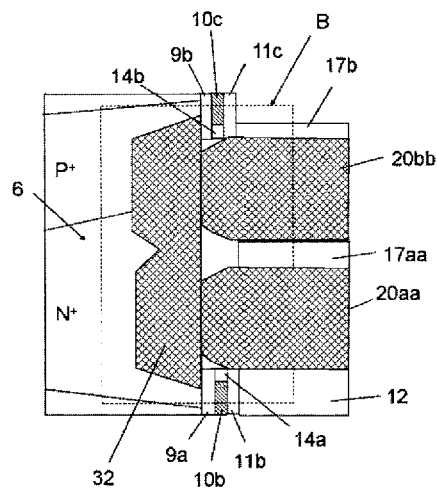
FIG. 2B is an enlarged sectional view of a dotted rectangle B in the sectional structural view of the CMOS inverter circuit for explanation of a method for producing a semiconductor device including an SGT according to the second embodiment in FIG. 2AB.

FIG. 2B is an enlarged view of a dotted rectangle B in FIG. 2AB. The silicide formation from the NiSi layers 20a and 20b into the Si pillar 6 in FIGS. 11B and 11C is isotropically expanded in the surface layer of the side surface of the Si pillar 6. For example, by changing the thickness of the $SiO_2$ layer 17aa, the NiSi layer 32 connected to the side surfaces of the NiSi layers 20aa and 20bb can be formed in the surface layer of the side surface of the Si pillar 6.

In this embodiment, the $N^+$ region 2a and the $P^+$ region 3a are mutually connected via the low-resistance NiSi layer 32. Accordingly, the direct connection between the output wiring metal layer Vout and the NiSi layer 20aa is not necessary. For this reason, the contact hole 28e may be formed such that the bottom surface thereof is within the NiSi layer 20bb or within the NiSi layer 20aa. This facilitates the formation of the contact hole 28e.

Third Embodiment

Hereinafter, referring to FIG. 3AA to FIG. 3BC, a method for producing a CMOS inverter circuit including an SGT according to a third embodiment of the present invention will be described. The CMOS inverter circuit according to the third embodiment is produced by the same steps as those illustrated in FIG. 1AA to FIG. 1LC in the first embodiment except for the following difference in the structure.

Figure 3A:
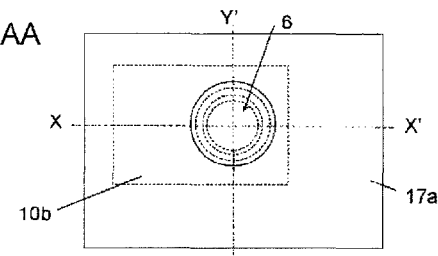
FIGS. 3AA, 3AB, and 3AC are respectively a plan view and sectional structural views of a CMOS inverter circuit for explanation of a method for producing a semiconductor device including an SGT according to a third embodiment of the present invention.
Figure 3A:
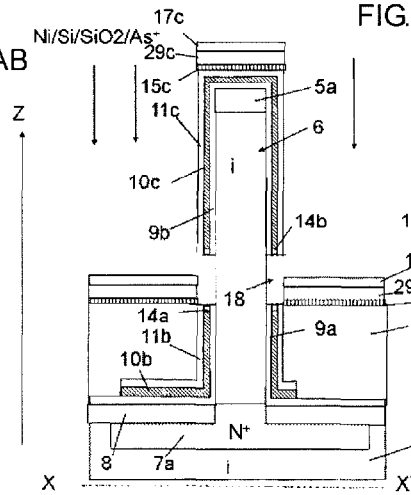
Figure 3A:
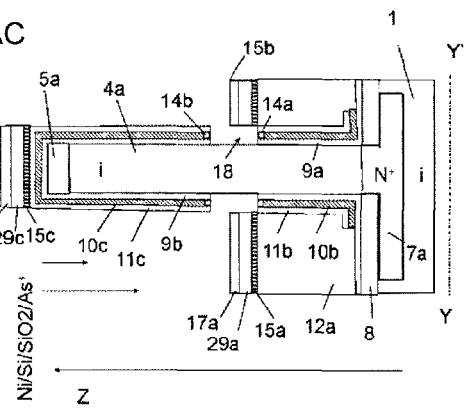

After the same steps as in FIG. 1AA to FIG. 1FC are carried out, as illustrated in FIGS. 3AB and 3AC, heat treatment is carried out to diffuse As atoms in the $N^+$ region 7 into the i-layer substrate to thereby form an $N^+$ region 7a. Subsequently, bias sputtering, for example, is carried out to direct Ni atoms in a direction perpendicular to the upper surface of the i-layer substrate 1, to thereby form a Ni layer 15a on the SiN layer 12a and form a Ni layer 15c on the Si pillar 6. Subsequently, bias sputtering is carried out to form a poly-Si layer 29a not containing impurity atoms and a SiO$_2$ layer 17a on the Ni layer 15a, and to form a poly-Si layer 29c not containing impurity atoms and SiO$_2$ layer 17c on the Ni layer 15c. Subsequently, ion implantation is carried out to implant donor impurity As ions into the poly-Si layers 29a and 29c.

Figure 3B:
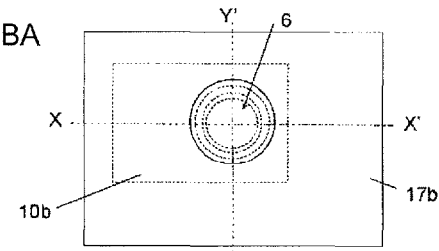
FIGS. 3BA, 3BB, and 3BC are respectively a plan view and sectional structural views of a CMOS inverter circuit for explanation of a method for producing a semiconductor device including an SGT according to the third embodiment.
Figure 3B:
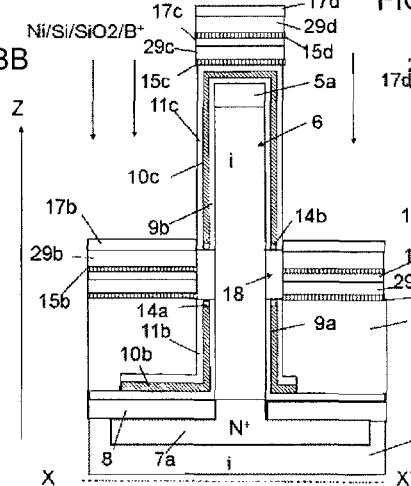
Figure 3B:
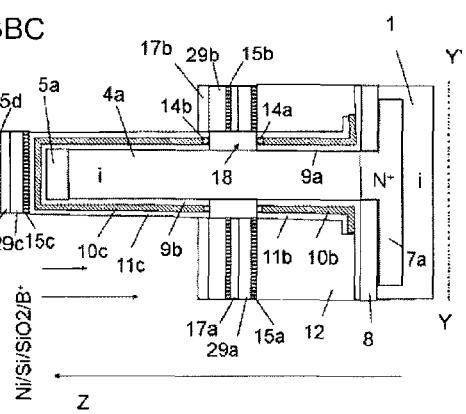
Figure 7:
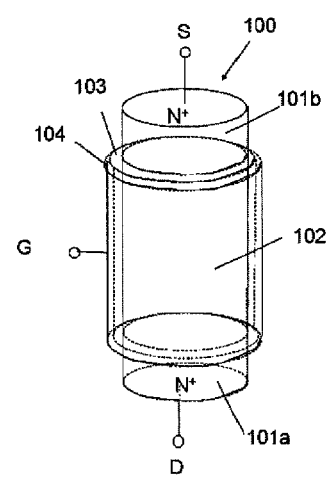
FIG. 7 is a schematic structural view illustrating an SGT as a conventional example.
Figure 8:
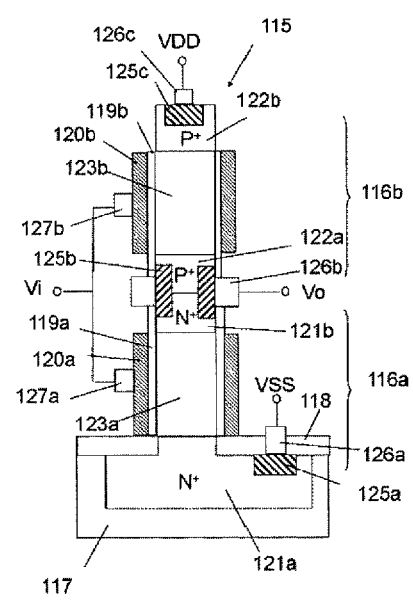
FIG. 8 is a schematic structural view of a CMOS inverter circuit as a conventional example in which an N channel SGT is formed in a lower portion of a single Si pillar and a P channel SGT is formed in an upper portion of the Si pillar.

Subsequently, as illustrated in FIGS. 3BB and 3BC, bias sputtering, for example, is carried out to direct Ni atoms in a direction perpendicular to the upper surface of the i-layer substrate 1, to thereby form a Ni layer 15b on the SiO$_2$ layer 17a and form a Ni layer 15d on the SiO$_2$ layer 17c. Subsequently, bias sputtering is carried out to form a poly-Si layer 29b not containing impurity atoms and a SiO$_2$ layer 17b on the Ni layer 15b and to form a poly-Si layer 29d not containing impurity atoms and a SiO$_2$ layer 17d on the SiO$_2$ layer 17c. Subsequently, ion implantation is carried out to implant acceptor impurity B ions into the poly-Si layers 29b and 29d.

In FIG. 3AA to FIG. 3BC, donor impurity As ions are implanted after deposition of the Ni layer 15a, the poly-Si layer 29a, and the SiO$_2$ layer 17a; and subsequently, acceptor impurity B ions are implanted after deposition of the Ni layer 15b, the poly-Si layer 29b, and the SiO$_2$ layer 17b. Alternatively, donor impurity As ions and acceptor impurity B ions may be implanted after the Ni layer 15a, the poly-Si layer 29a, the SiO$_2$ layer 17a, the Ni layer 15b, the poly-Si layer 29b, and the SiO$_2$ layer 17b are successively deposited. The ion implantations are carried out in the following manner: at an increased ion implantation voltage, the maximum distribution of As atoms is positioned in a lower layer, the poly-Si layer 29a; and the ion implantation voltage is changed such that the maximum distribution of B atoms is positioned in an upper layer, the poly-Si layer 29b. Thus, the poly-Si layer 29a containing donor impurity As atoms and the poly-Si layer 29b containing acceptor impurity B atoms are formed.

In the third embodiment, ion implantation is used to introduce donor impurity and acceptor impurity into the poly-Si layers 29a and 29b. In the formation of a circuit including a plurality of Si pillars 6, the Si pillars 6 are individually covered with a resist layer or exposed through openings in the resist layer patterned by lithography, for example, and subsequently donor or acceptor impurity atom ions are implanted, so that upper and lower SGTs of the Si pillars 6 can be each formed as an N channel SGT or a P channel SGT depending on the design of the circuit. In this way, various types of circuits can be formed on a wafer.

Fourth Embodiment

Hereinafter, referring to FIGS. 4A to 4C, a CMOS inverter circuit including an SGT according to a fourth embodiment of the present invention will be described.

As illustrated in FIGS. 4B and 4C, NiSi layers 31c and 31d are respectively formed within the N$^+$ region 2a and the P$^+$ region 3a within the Si pillar 6. In the NiSi layers 31c and 31d, silicide is formed in the region from the side surfaces of the NiSi layers 20aa and 20bb to the center in cross section of the Si pillar 6. In this case, the NiSi layers 31c and 31d may be in contact with each other.

In FIGS. 11B and 11C, the NiSi layers 31a and 31b are formed in the surface layer of the side surface of the Si pillar 6. In contrast, in the fourth embodiment, the NiSi layers 31c and 31d corresponding to the NiSi layers 31a and 31b are formed by formation of silicide to the center of cross section of the Si pillar 6.

In the fourth embodiment, collapse or bending of the Si pillar 6 due to the presence of the NiSi layers 31c and 31d, which have an expansion coefficient different from that of the Si pillar 6 and are formed over the whole cross sections and at intermediate heights, can be suppressed by the NiSi layers 20aa and 20bb, which are left without being removed around the NiSi layers 31c and 31d. This configuration is more effective in a case where the Si pillar 6 has a small cross-section diameter.

Fifth Embodiment

Hereinafter, referring to FIGS. 5A to 5C, a CMOS inverter circuit including an SGT according to a fifth embodiment of the present invention will be described.

As illustrated in FIGS. 5B and 5C, a $Si_{1-x}Ge_x$ layer 33 (for example, x=0.17) containing acceptor atoms is formed at the top of the Si pillar 6. The $Si_{1-x}Ge_x$ layer 33 corresponds to the P$^+$ region 24 in FIGS. 11B and 11C and serves as a drain layer of a P channel SGT. The $Si_{1-x}Ge_x$ layer 33 produces stress due to the difference in Si-atom interplanar spacing between the $Si_{1-x}Ge_x$ layer 33 and the Si pillar 6, the stress being directed from the $Si_{1-x}Ge_x$ layer 33 downward in the Si pillar 6. The P$^+$ region 3a positioned at an intermediate height of the Si pillar 6 is subjected to compressive stress applied by the NiSi layers 20aa and 20bb, which protrude and are connected to the circumference of the Si pillar 6. This compressive stress has a stress component directed from the P$^+$ region 3a upward in the Si pillar 6.

In the fifth embodiment, the channel layer 1b of a P channel SGT in the Si pillar 6, the channel layer 1b being sandwiched between the $Si_{1-x}Ge_x$ layer 33 and the P$^+$ region 3a, is subjected to compressive stress applied by the $Si_{1-x}Ge_x$ layer 33 and the P$^+$ region 3a. This results in an increase in hole mobility and enhancement of the current drive capability of the P channel SGT (regarding a phenomenon in which compressive stress increases the hole mobility of a P channel MOS transistor, refer to, for example, S. E. Thompson, G. Sun, Y. S. Choi, and T. Nishida: "Uniaxial-Process-Induced-Si: Exteding the COM Roadmap", IEEE Transaction on Electron Devices, Vol. 53, No. 5, pp. 1010-1020 (1995)).

Sixth Embodiment

Hereinafter, referring to FIG. 6AA to FIG. 6BC, a method for producing a CMOS inverter circuit including an SGT according to a sixth embodiment of the present invention will be described. The CMOS inverter circuit according to the sixth embodiment is produced by the same steps as those illustrated in FIG. 1AA to FIG. 1LC in the first embodiment except for the following difference in the structure.

In the step illustrated in FIGS. 1GA to 1GD, as illustrated in FIGS. 6AA to 6AC, bias sputtering is carried out to direct material atoms in a direction perpendicular to the upper surface of the i-layer substrate 1 to thereby form, on a SiN layer 12a, a Ni layer 15a, an N-type poly-Si layer 16a containing arsenic (As) impurity, a SiO$_2$ layer 17a, a Ni layer 15b, an N-type poly-Si layer 16b containing arsenic (As) impurity, and a SiO$_2$ layer 17b.

Subsequently, referring to FIGS. 6BA to 6BC, ion implantation is carried out to implant acceptor impurity B atoms into the poly-Si layer 16b such that the resultant concentration of the acceptor impurity is higher than the concentration of donor impurity originally contained in the poly-Si layer 16b. As a result, a P-type poly-Si layer 16b is provided. After that, the steps in FIG. 1HA to FIG. 1LC are carried out.

In the sixth embodiment, the number of ion implantation steps carried out in the third embodiment can be reduced by half. For example, in order to provide lower and upper SGTs of different channel types in a plurality of Si pillars 6, two steps of implanting ions of donor or acceptor impurity atoms into poly-Si layers 16a and 16b are necessary. In contrast, a single ion implantation step will suffice in the sixth embodiment.

In the first embodiment, material atoms are directed in a direction perpendicular to the upper surface of the i-layer substrate 1 by bias sputtering to thereby form the Ni layers 15a and 15b, the poly-Si layers 16a and 16b, and the SiO$_2$ layers 17a and 17b. Alternatively, a process other than bias sputtering may be used as long as material atoms can be directed in a direction perpendicular to the upper surface of the i-layer substrate 1. The same can be applied to other embodiments according to the present invention.

In the first embodiment, the poly-Si layers 16a and 16b are turned into silicide to cause protrusion of the NiSi layers 20a and 20b into the space 18. Instead of the Ni layers 15a and 15b, other metal layers such as titanium (Ti) layers or cobalt (Co) layers may be used to cause protrusion of silicide layers into the space 18. The same can be applied to other embodiments according to the present invention.

In the first embodiment, the Ni layers 15a and 15b are formed as lower layers and the poly-Si layers 16a and 16b containing a donor or acceptor impurity are formed as upper layers. Alternatively, the Ni layers 15a and 15b may be formed as upper layers and the poly-Si layers 16a and 16b containing a donor or acceptor impurity may be formed as lower layers. The same can be applied to other embodiments according to the present invention.

In the first embodiment, two layers of the Ni layer 15a and the poly-Si layer 16a are formed, and two layers of the Ni layer 15b and the poly-Si layer 16b are formed; and the former and the latter are subsequently subjected to heat treatment to respectively form the NiSi layers 20a and 20b. Alternatively, each of the NiSi layers 20a and 20b may be formed from a plurality of Ni layers and a plurality of poly-Si layers. Alternatively, a Ni layer and another metal layer may be used to form a silicide layer. In the first embodiment, the poly-Si layers 16a and 16b are entirely turned into silicide to form the NiSi layers 20a and 20b. Alternatively, after the heat treatment, portions of the poly-Si layers 16a and 16b may remain. These portions of the poly-Si layers 16a and 16b may remain even after the final step of producing SGTs. The same can be applied to other embodiments according to the present invention.

In the first embodiment, the Si pillar 6 is formed such that the side surface thereof substantially forms a right angle (about 90°) with the upper surface of the i-layer substrate 1; and material atoms are directed in a direction perpendicular to the upper surface of the i-layer substrate 1 by bias sputtering to thereby form the Ni layers 15a and 15b, the poly-Si layers 16a and 16b, and the SiO$_2$ layers 17a and 17b. In this embodiment, the side surface of the Si pillar 6 is set to form substantially a right angle with the upper surface of the i-layer substrate 1, to thereby suppress deposition of Ni, Si, and SiO$_2$ material atoms on the side surface of the SiO$_2$ layer 11c surrounding the Si pillar 6. The angle of the side surface of the Si pillar 6 may be less than 90° as long as Ni, Si, and SiO$_2$ material atoms are not deposited on the side surface of the SiO$_2$ layer 11c surrounding the Si pillar 6. In a case of bias sputtering, for example, a bias voltage applied between a substrate electrode plate on which the i-layer substrate 1 is placed and a counter electrode plate separated from the i-layer substrate 1, is controlled to thereby suppress deposition of Ni, Si, SiO$_2$ material atoms on the side surface of the SiO$_2$ layer 11c (regarding a basic technique of this process, refer to C. Y. Ting, V. J. Vivalda, and H. G. Schaefer: "Study of planarized sputter-deposited SiO2" J. Vac. Sci. Technol, 15(3), May/June (1978)). Ni, Si, and SiO$_2$ material atoms that have deposited on the side surface of the SiO$_2$ layer 11c but can be easily etched off by diluted hydrofluoric acid, for example, do not cause a problem. The same can be applied to other embodiments according to the present invention.

In the first embodiment, heat treatments are carried out in FIG. 1HA to FIG. 1IC to connect the side surface of the Si pillar 6 and the NiSi layers 20a and 20b, to form the NiSi layers 31a and 31b in the Si pillar 6, and to form the N$^+$ region 2a and the P$^+$ region 3a. These connection between the side surface of the Si pillar 6 and the NiSi layers 20a and 20b, formation of the NiSi layers 31a and 31b in the Si pillar 6, and formation of the N$^+$ region 2a and the P$^+$ region 3a may be performed in other steps as long as they are performed by the final step of producing SGTs. The NiSi layers 20a and 20b may undergo changes in the Ni—Si content ratios and may be present as layers such as NiSi$_2$ layers in the final step of producing SGTs. The same can be applied to other embodiments according to the present invention.

In the first embodiment, the poly-Si layers 16a and 16b are used. Alternatively, amorphous layers may be used. The same can be applied to other embodiments according to the present invention.

In the first embodiment, the SiN layers 12a and 12b, which are single-material layers, are used. Alternatively, a SiO$_2$ layer serving as a lower layer and a SiN layer serving as an upper layer may be used. Instead of the SiN layers 12a and 12b, insulating material layers having a low diffusion coefficient of HF ions may be used. The same can be applied to other embodiments according to the present invention.

In the fourth embodiment, silicide is formed to the center of cross section of the Si pillar 6 to form the NiSi layers 31c and 31d. The same, which does not cause any problems in SGT operations in other embodiments according to the present invention, can be applied to other embodiments.

In the above-described embodiments, semiconductor pillars that are Si (silicon) pillars are used as examples. The technical idea of the present invention is not limited to these embodiments and can be applied to semiconductor devices including SGTs including semiconductor pillars formed of semiconductor materials other than silicon.

In the above-described embodiments, the methods for producing a semiconductor device including two SGTs in a single Si pillar are described. However, the technical idea of the present invention is not limited to these methods and can also be applied to a method for producing a semiconductor device including one SGT or three or more SGTs in a single semiconductor pillar.

In the first embodiment, an N channel SGT is formed in a lower portion of the Si pillar 6 and a P channel SGT is formed in an upper portion of the Si pillar 6. The technical idea of the present invention can also be applied to a circuit in which a P channel SGT is formed in a lower portion of the Si pillar 6 and an N channel SGT is formed in an upper portion of the Si pillar 6. The technical idea of the present invention can also be applied to a circuit in which N channel SGTs or P channel SGTs are formed in both of upper and lower portions of the Si pillar 6. The same can be applied to other embodiments according to the present invention.

In the above-described embodiments, SGTs have a configuration in which the $HfO_2$ layer (gate insulating layer) 9c is formed around a semiconductor pillar such as the Si pillar 6 and the TiN layer (gate conductor layer) 10d is formed around the $HfO_2$ layer 9c. However, the technical idea of the present invention is not limited to this configuration and can also be applied to a nonvolatile memory element in which an electrically floating conductor layer or a charge storage layer such as a SiN layer is disposed between a gate insulating layer and a gate conductor layer because this nonvolatile memory element is one type of SGTs. In this case, instead of a $HfO_2$ layer, a $SiO_2$ layer is preferably used as a tunnel oxide film.

In the above-described embodiments, the technical idea of the present invention is applied to CMOS inverter circuits. Alternatively, the technical idea of the present invention can also be applied to other semiconductor devices such as circuits, devices, and elements.

In the first embodiment, the gate conductor layers are the TiN layers 10b and 10d. The present invention is not limited to this embodiment and the gate conductor layers may be formed of another metal material. The gate conductor layers may have a multilayer structure including a metal layer and a poly-Si layer, for example. The impurity region constituted by the $N^+$ region 2a and the $P^+$ region 3a may have this configuration of impurity layers of different conductivity types, or may have a configuration of impurity layers of the same conductivity type. In a case where an impurity region is constituted by two impurity layers of the same conductivity type, these two impurity layers constitute as a whole a single impurity region of the same conductivity type. On the other hand, in a case where an impurity region is constituted by two impurity layers of different conductivity types, these two impurity layers similarly constitute as a whole a single impurity region. Such configurations can also be applied to other embodiments according to the present invention.

In the first embodiment, the gate insulating layer is a $HfO_2$ layer. However, the present invention is not limited to this embodiment and the gate insulating layer may be formed of another insulating material.

In the first embodiment, in FIGS. 1FA to 1FC, after the opening 30a is formed in the side surface of the Si pillar 6, exposed portions of the TiN layers 10b and 10c are oxidized to form the insulating TiO layers 14a and 14b. Alternatively, instead of the insulating TiO layers 14a and 14b, other insulating layers such as $SiO_2$ layers may be formed. For example, in FIGS. 1FA to 1FC, a $SiO_2$ film may be formed by ALD so as to cover the entirety of the Si pillar 6; and subsequently the same process used for forming the opening 30a in FIGS. 1EA to 1EC may be carried out to form an opening while exposed portions of the TiN layers 10b and 10c are covered with the $SiO_2$ layer. In a case where the exposed portions of the TiN layers 10b and 10d in FIGS. 1LA to 1LC are not in contact with the NiSi layers 20aa and 20bb, the insulating TiO layers 14a and 14b may be omitted. In this case, the spaces between the TiN layer 10b and the NiSi layer 20aa and between the TiN layer 10d and the NiSi layer 20bb serve as insulating layers.

In the above-described embodiments, the i-layer substrate 1 may be replaced by an SOI (Silicon on Insulator) substrate.

In the first embodiment, the $N^+$ region 2a is in contact with the $P^+$ region 3a. Alternatively, the technical idea of the present invention can also be applied to a case where an insulating layer is formed between the $N^+$ region 2a and the $P^+$ region 3a. The same applies to other embodiments of the present invention.

In the fifth embodiment, the $Si_{1-x}Ge_x$ layer 33 producing stress directed downward in the Si pillar 6 is formed at the top of the Si pillar 6. Alternatively, another material layer may be used that produces stress directed downward in the Si pillar 6 and serves as a source or drain of a P channel SGT.

The present invention encompasses various embodiments and modifications without departing from the broad spirit and scope of the present invention. The above-described embodiments are used for explaining embodiments of the present invention and do not limit the scope of the present invention. The above-described embodiments and modifications can be combined in a desired manner. Even in the cases where some features in the above-described embodiments are omitted, these cases are in the scope of the technical idea of the present invention.

A method for producing a pillar-shaped semiconductor device according to an embodiment of the present invention can provide semiconductor devices having high integration degrees.

What is claimed is:

1. A pillar-shaped semiconductor device comprising:
   a semiconductor pillar on a substrate and oriented perpendicular to a surface of the substrate;
   an impurity region within the semiconductor pillar and containing donor or acceptor atoms;
   a metal-semiconductor alloy layer in contact with a side surface of the impurity region, and within and around the semiconductor pillar; and
   two interlayer insulating layers sandwiching the metal-semiconductor alloy layer,
   wherein at least one of the two interlayer insulating layers is separated from a side surface of the semiconductor pillar,
   wherein the metal-semiconductor alloy layer includes extension regions in the semiconductor pillar containing metal atoms, semiconductor atoms, and donor or acceptor atoms, where at least some of the donor or acceptor atoms reside in the semiconductor pillar after being pushed out from the metal-semiconductor alloy layer under a heat treatment and into the impurity region of the semiconductor pillar.

2. The pillar-shaped semiconductor device according to claim 1, further comprising:
   a gate insulating layer surrounding the semiconductor pillar;
   a gate conductor layer surrounding the gate insulating layer;
   a first interlayer insulating layer surrounding the gate conductor layer;
   a first impurity region under the semiconductor pillar and containing donor or acceptor atoms;
   a second impurity region above the first impurity region and within the semiconductor pillar and of the same conductivity type as the first impurity region;
   wherein the impurity region comprises a third impurity region on or above the second impurity region and within the semiconductor pillar and containing the donor or acceptor atoms;
   a fourth impurity region above the third impurity region and within the semiconductor pillar and of the same conductivity type as the third impurity region;
   a first alloy layer in contact with a side surface of the second impurity region;

wherein the metal-semiconductor alloy layer comprises a second alloy layer in contact with a side surface of the third impurity region;

a second interlayer insulating layer comprising one of the two interlayer insulating layers, and in contact with an upper surface of the first alloy layer and a lower surface of the second alloy layer, and separated from the side surface of the semiconductor pillar; and a third interlayer insulating layer comprising another one of the two interlayer insulating layers, and on an upper surface of the second alloy layer, and in contact with a side surface of the first interlayer insulating layer, wherein a first SGT (Surrounding Gate MOS Transistor) is comprised of one of the first impurity region and the second impurity region comprising a source, and another one of the first impurity region and the second impurity region comprising a drain, and a portion of the semiconductor pillar between the first impurity region and the second impurity region comprising a channel, and the gate conductor layer comprising a gate, and a second SGT comprising one of the third impurity region and the fourth impurity region comprising a source, and another one of the third impurity region and the fourth impurity region comprising a drain, and a portion of the semiconductor pillar between the third impurity region and the fourth impurity region that comprising a channel, and the gate conductor layer functions as a gate.

3. The pillar-shaped semiconductor device according to claim 2, further comprising:

a third alloy layer within the semiconductor pillar and connecting the second impurity region and the first alloy layer; and a fourth alloy layer within the semiconductor pillar and connecting the third impurity region and the second alloy layer.

4. The pillar-shaped semiconductor device according to claim 3, wherein the third alloy layer and the fourth alloy layer are mutually connected within the semiconductor pillar.

5. The pillar-shaped semiconductor device according to claim 3, wherein the third alloy layer and the fourth alloy layer extend to a center of the semiconductor pillar in plan view.

6. The pillar-shaped semiconductor device according to claim 2, wherein the first alloy layer and the second alloy layer are wiring conductor material layers.

7. The pillar-shaped semiconductor device according to claim 2, wherein the first alloy layer and the second alloy layer are connected via a contact hole extending through both of the first alloy layer and the second alloy layer, to a wiring metal layer above the contact hole.

8. The pillar-shaped semiconductor device according to claim 2, wherein stress directed downward from the fourth impurity region is produced within the semiconductor pillar.

9. The pillar-shaped semiconductor device according to claim 2, wherein both the first alloy layer and the second alloy layer are separated from the gate conductor layer by spaces.

* * * * *